United States Patent [19]

Scheinbeim et al.

[11] Patent Number: 5,356,500

[45] Date of Patent: Oct. 18, 1994

[54] PIEZOELECTRIC LAMINATE FILMS AND PROCESSES FOR THEIR MANUFACTURE

[75] Inventors: Jerry I. Scheinbeim, Somerset; Brian A. Newman, Highland Park; Ji Su, Piscataway, all of N.J.

[73] Assignee: Rutgers, The State University of New Jersey, New Brunswick, N.J.

[21] Appl. No.: 854,110

[22] Filed: Mar. 20, 1992

[51] Int. Cl.$^5$ ............... B32B 31/00; H01L 41/22
[52] U.S. Cl. ................... 156/229; 156/308.2; 156/309.6; 156/311; 156/272.2; 310/311; 29/25.35
[58] Field of Search ............ 156/229, 299, 300, 309.6, 156/311; 29/25.35; 252/62.9 R; 310/311, 357

[56] References Cited

U.S. PATENT DOCUMENTS

| | | | |
|---|---|---|---|
| 4,302,408 | 11/1981 | Ichihara et al. | 29/25.35 |
| 4,405,402 | 9/1983 | Quilliam | 156/311 X |
| 4,521,322 | 6/1985 | Broussoux et al. | 310/311 X |
| 4,877,988 | 10/1989 | McGinniss et al. | 310/311 X |

Primary Examiner—David A. Simmons
Assistant Examiner—M. Curtis Mayes
Attorney, Agent, or Firm—Leroy G. Sinn

[57] ABSTRACT

Provided by this invention are piezoelectric laminate films wherein films of different polymers are in laminated relationship. The piezoelectric laminate film has at least one property which is superior to the corresponding property in the films used in the lamination to form the laminate. Also provided is a method for making the laminate.

5 Claims, 33 Drawing Sheets

PIEZOELECTRIC LAMINATE FILMS AND PROCESSES FOR THEIR MANUFACTURE

This invention was made with government support under the Office of Naval Research, Grant No. N00014-91J-1078 and the government has certain rights in the invention.

TECHNICAL FIELD

This invention relates to piezoelectric laminate films and processes for their manufacture. It provides piezoelectric laminate films which have improved properties over certain properties of the individual film layers. The film layers comprise different polymeric materials so that the two faces of respective film layers have differing polymeric materials.

BACKGROUND ART

Certain polymeric materials are capable of being polarized. In general, it has been found in the past that a polymeric material such as poly(vinylidene fluoride) can be polarized as by stretching a film at a temperature below its melting point, such as at room temperature or at a temperature of about 70° C. Stretching can be on an uniaxial basis or a biaxial basis and often the film is stretched to increase the length by two or three times. The film then is subjected to a DC field of at least 1 MV/cm. Poly(vinylidene fluoride) is a common and a preferred material for polarization, since it has been found to have a high capability of polarization response, thereby providing desirable piezoelectric properties. Subjecting such a stretched film, for example, using an appropriate DC field applied in a direction perpendicular to the plane of the stretched field causes an orientation of the molecular dipoles of the polymeric materials. In case of the poly(vinylidene fluoride), fluorine groups have a negative charge and the hydrogen atoms attached to the other carbon of the vinylidene fluoride unit of the polymer have a positive charge. Vinylidene fluoride units in a poly(vinylidene fluoride) can exist in at least two different crystalline forms, in a planar zig-zag polar form or trans form (beta form or Form 1) or a non-polar and non-planar form referred to as alpha form or Form 2.

Many other polymeric materials can be polarized to provide piezoelectric films in a like manner. It is desired to provide piezoelectric polymeric film materials which provide improved ferro- and piezoelectric activities which are improved over those of the individual polymeric materials, especially at elevated temperatures.

Such polarized materials have a number of uses, including use in the making of transducers, push button onoff switches and many other uses which utilize ferro- or piezoelectric properties of such polarized materials.

It would be highly desired to have improved piezoelectric polymeric films which have improved ferro- or piezoelectric properties. Likewise, it would be highly desired to provide improved process for making such improved piezoelectric film materials.

SUMMARY OF INVENTION

A piezoelectric laminate film is provided which comprises two or more polymeric films wherein the lamination of the surfaces of said films can be accomplished by lamination of the surfaces to each other by melting the surfaces thereof and application of pressure to cause the lamination of the respective surfaces, said lamination being of surfaces of polymeric films of different polymers, said piezoelectric laminate film having one or more ferro- or piezoelectric properties superior to those of the individual polymeric films which are components of the laminate film. The individual polymeric films used in making the laminate film are capable of forming a piezoelectric polymeric film. A feature of the films whose surfaces are melted and placed in contact with each other to form the laminate are of different polymeric character as to the units forming the polymers thereof. The laminate films provided by this invention provide one or more improved ferro- or piezoelectric activities or properties which are substantially superior to the the ferro- or piezoelectric properties of the individual polymeric films used in forming the piezoelectric laminate films of this invention. It is desired that the improvement in one or more of the ferro- or piezoelectric properties be at least 20, 30 or 40 percent over the corresponding property of the individual component film layer.

Among the properties which show substantial improvement are piezoelectric strain and stress constants, $d_{31}$ and $e_{31}$ and remanent polarization, $P_r$.

A presently desired laminate film coming within this invention comprises a Nylon 11 or Nylon 7/poly(vinylidene fluoride) laminate. This particular piezoelectric laminate film coming within the invention has provided significantly enhanced ferroelectric and piezoelectric responses or properties. The enhanced ferro- and piezoelectric properties shown by these presently preferred piezoelectric laminate films represent considerable improvement over what would be expected based upon the corresponding values of the respective piezoelectric films making up the laminate on an individual basis.

Other polymeric films can be used which can be polarized to provide piezoelectric films. Such other laminate films include but are not limited to other odd Nylons, vinylidene fluoride copolymers such as $VF_2$-$VF_3$ copolymers together with poly(vinylidene fluoride) film or other polarizable polymeric film.

More than two polymeric films can be laminated to form a trilaminate film or higher level of laminate film coming within this invention, so long as said laminate provides improved properties over the expected properties of the individual polymeric films used to make the laminate film. A feature of lamination to provide the laminate films of the invention involves polymeric surfaces of different polymers which in themselves are capable of being polarized. It might be indicated for some reason to those skilled in the art to have a multi-film layer laminate in which not all of the laminated surfaces involve different polymers. However, at least one of the laminations require the lamination of film surfaces of a different polymers. For example, the laminate can be multilaminate involving an alternation of two polymeric films, for example, polymeric film A-polymeric film B-polymeric film A-polymeric film B-polymeric film A. A limitation is that the piezoelectric polymeric film laminate provided hereby provides superior properties over what is expected based upon the individual properties of the films which comprise the laminate film.

Provided by this invention also is a method of providing the laminate films of the invention. The process comprises first melting the two films which are to be placed in contact with each other. The two films are co-melt pressed between suitable surfaces. A suitable laminating temperature and pressure will be used. If the two films are Nylon 11 and poly(vinylidene fluoride) films, the melt pressing can effectively be carried out at 190° C. and 210° C. The poly(vinylidene fluoride) and Nylon 11 films are produced individually as by melt pressing Nylon 11 and a poly(vinylidene fluoride) material at a suitable temperature, for example, at 210° C. and 190° C. The individual films then are quenched as by immediately being immersed into ice water. The two quenched poly(vinylidene fluoride) and Nylon 11 films then can be co-melt pressed between two suitable bases, at a suitable temperature, such as 205°–210° C. The laminate then is immediately quenched as by immersion in ice water to obtain the Nylon 11/poly(vinylidene fluoride) bilaminate film. The film then is cold drawn uniaxially or biaxially to provide suitable stretching, for example, 2.5 to 4, or desirably 3.0 to 3.5:1. The drawing suitably is done at room temperature or at another temperature below the melting point of the respective polymers. The stretched bilaminate piezoelectric polymer film then is polarized. The piezoelectric laminate film can be suitably annealed as desired.

Suitable thickness of the stretched bilaminate films can be about 20 to about 50 micrometers. Other thicknesses can be used so long as the final laminate film provides a desired improvement and fits a need for the piezoelectric bilaminate film.

DETAILED DESCRIPTION OF THE INVENTION AND THE PREFERRED EMBODIMENTS

Figure 1:
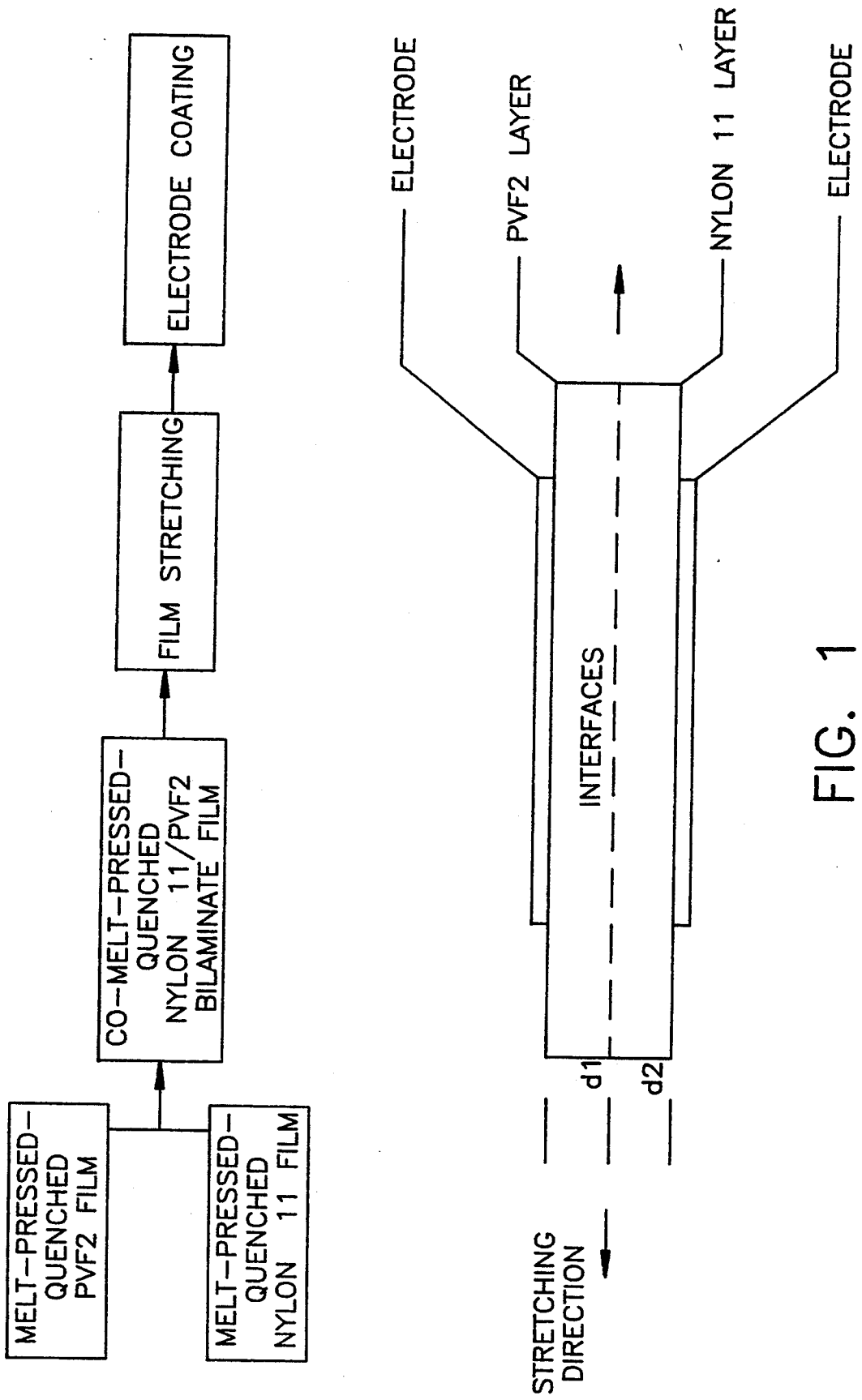
FIG. 1 is a diagram showing in schematic form the preparation and composition of the piezoelectric laminate films of the invention.

The piezoelectric bilaminate films or the multiple laminate films having more than two film lamina coming within this invention can be made by following the general description that follows. In illustration, a Nylon 11 film and a poly(vinylidene fluoride) film can be used to form a bilaminate. A number of other polymer films can be used rather than either Nylon 11 or poly(vinylidene fluoride) so long as the films can be polarized and provide the one or more superior ferroelectric or piezoelectric or both.

In the illustration, the poly(vinylidene fluoride) and Nylon 11 films are individually formed by melt-pressing at 90° and 210° C. The individual films are then quenched. The quenching can be done simply by quickly immersing the melt-formed film into ice water. The two quenched films can then be co-melted and placed in intimate contact, pressed at a suitable elevated temperature to cause lamination. The application of pressure to cause the lamination can result from placing the melted films between two metallic surfaces, such as aluminum surfaces, and then to apply pressure to cause the films to laminate.

The films then are cold drawn. Ordinarily, they are cold-drawn to provide a uniaxial orientation. The ratio of stretch to the original length in the drawing process can vary. However, about a 3:1 ratio of draw is ordinarily adequate. However, the ratio can be varied as desired depending upon the uses intended and the polymers and laminates being prepared.

The cold-drawing can be done in conventional manner. For example, it has been found suitable to cold-draw the polymer film laminate to a ratio of 2 to 4:1 or generally suitably 3.0 to 3.5:1 at room temperature. Other ratios of cold draw can be used so long as they are suitable and fit into the desired end use. Other temperatures can be desired and can be preferable depending upon the polymers, conditions, desired final products and the like.

Polymeric materials which can be used in making the piezoelectric laminate films of this invention can vary widely so long as the polymeric films have a polarization capability and films laminated are selected which are capable of forming a suitable laminating relationship to provide the piezoelectric laminate films of this invention.

Polymers which can be used to make the films used to make the piezoelectric films of this invention can vary widely so long as they have a polarization capability. As mentioned above, a preferred material is poly(vinylidene fluoride). Copolymers of vinylidene fluoride are also desirable materials, such as vinylidene fluoride copolymers with vinyl fluoride, trifluoroethylene, tetrafluoroethylene, vinyl chloride, methylmethacrylate, and others. The vinylidene fluoride content can vary in the range of from about 30 percent to about 95 percent based on the total polymer weight. Other polymers which can be used are poiyvinylchloride, polymethylacrylate, polymethylmethacrylate, vinylidene cyanide/vinyl acetate copolymers, vinylidene cyanide/ vinyl benzoate copolymers, vinylidene cyanide/isobutylene copolymers, vinylidene cyanide/methyl methacrylate copolymers, polyvinylfluoride, polyacrylonitrile, polycarbonate, and nylons such as Nylon-7, Nylon-11 and other odd Nylons, natural polymers such as cellulose and proteins, synthetic polymers such as derivatives of cellulose, such as esters and ethers, and the like.

The polymeric piezoelectric bilaminate films coming within this invention are made by utilizing a poling step to provide the piezoelectric properties. The poling is, in general, carried out according to conventional procedures. The bilaminate films can, for example, be desirably poled by applying an electric field with a triangular shape at room temperature. It has been found suitable to utilize a triangular high voltage waveform for 1,000 s at a maximum field of 160 MV/m, or other suitable conditions. These conditions can be varied as desired with a principal goal being polarizing as rapidly as possible for economic reasons but yet to avoid degradation of the polymer. The polymer film laminates can be placed in an environment during the poling to protect the laminate film from space discharge. It has been found suitable to utilize a protective environment such as silicone oil or other suitable environments. The stretched bilaminate films or multilaminate films are placed between suitable electrodes for poling and the poling is carried out for a sufficient time to provide the desired level of polarization.

The polarization can be carried out employing corona discharge if desired. Also the process can be made continuous by placing the film on a moving conveyer in suitable arrangement with corona discharge elements.

The measurements of the piezoelectric laminate films provided hereby are carried out following generally conventional and known procedures.

The electric displacement versus electric field (D-E) hysteresis characteristics can be measured with a picoammeter (Keithley 485) connected in series with a laminate film sample while the poling treatment was going on. The poling and D-E measurement can be controlled by microcomputer.

Piezoelectric strain constant, $d_{31}$, and piezoelectric stress constant, $e_{31}$, are measured by using a Rheolograph Solid instrument (Toyoseiki).

Young's modulus, C, and dielectric constant, $\epsilon$, are also measured using the instrument. Temperature range used in the measurement is $-150°$ C. to $140°$ C. The heating rate is $3°$C./minute and the frequency applied in the measurements is 104 Hz.

EXAMPLE 1

The preparation of the piezoelectric laminate film of the Example is depicted in FIG. 1.

1. Sample Film Preparation

Nylon 11/PVF$_2$ bilaminate films are prepared using poly(vinylidene fluoride) (PVF$_2$) powder supplied by Soltex Polymer Corporation (HM 1012) and Nylon 11 pellets supplied by Rilson Co. First, PVF$_2$ and Nylon 11 films are produced individually by melt-pressing at $190°$ C. and $210°$ C., respectively. The films are then quenched by immersing immediately into ice water. The PVF$_2$ and Nylon 11 films are then co-melt-pressed between aluminum foils with proper spacers, at $205°-210°$ C., followed by quenching the resulting laminate in ice water to obtain the Nylon 11/PVF$_2$ bilaminate films. The films are then uniaxially oriented by stretching to a ratio of 3.5:1 at room temperature. The final thickness of the stretched bilaminate films is 20–50 micrometers.

The films are tested by optical microscopy and X-ray diffraction methods. The examinations show that connected interfaces clearly exist between the Nylon 11 film layer and PVF$_2$ film layer of the bilaminate films. Also, the molecular chains of the PVF$_2$ component are oriented along the drawing direction and Nylon 11 component shows three dimensional orientation and Nylon 11 polymer chains are also oriented in the drawing direction.

Gold electrodes are then coated on opposing surfaces of the stretched laminate films by evaporation under the vacuum condition of about $10^{-6}$ torr. The coating is carried out by three 10-second evaporations with 10-minute intervals between each evaporation to protect the films from being overheated. The electrodes have a rectangle shape with an area of about 10 mm$^2$ (2 mm×5 mm). The final sample film and the processing procedure are illustrated in FIG. 1.

2. Poling Treatment and Measurements

The Nylon 11/PVF$_2$ bilaminate sample films are poled by an electric field applied with a triangular shape at room temperature. The period of application of the triangular high voltage waveform is 1000s and the maximum of the field is 160 MV/m. The sample is immersed in Silicon oil during the poling treatment to protect the sample from space discharge.

The electric displacement versus electric field (D-E) hysteresis characteristics is measured with a picoammeter (Keithley 485) connected in series with the sample while the poling treatment is carried out. The poling and D-E measurements are controlled by microcomputer.

The temperature dependence of piezoelectric properties, piezoelectric strain constant, $d_{31}$, and piezoelectric stress constant, $e_{31}$, are measured using a Theolograph Solid (Toyoseiki) instrument along with the measurements of Young's modulus, C, and dielectric constant, $\epsilon$. The temperature range applied in the measurement is $-150°$ C.$-140°$ C. The heating rate is $3°$C./min. and the frequency applied in the measurements is 104 Hz.

3. J-E and D-E Hysteresis Characteristics

Figure 2:
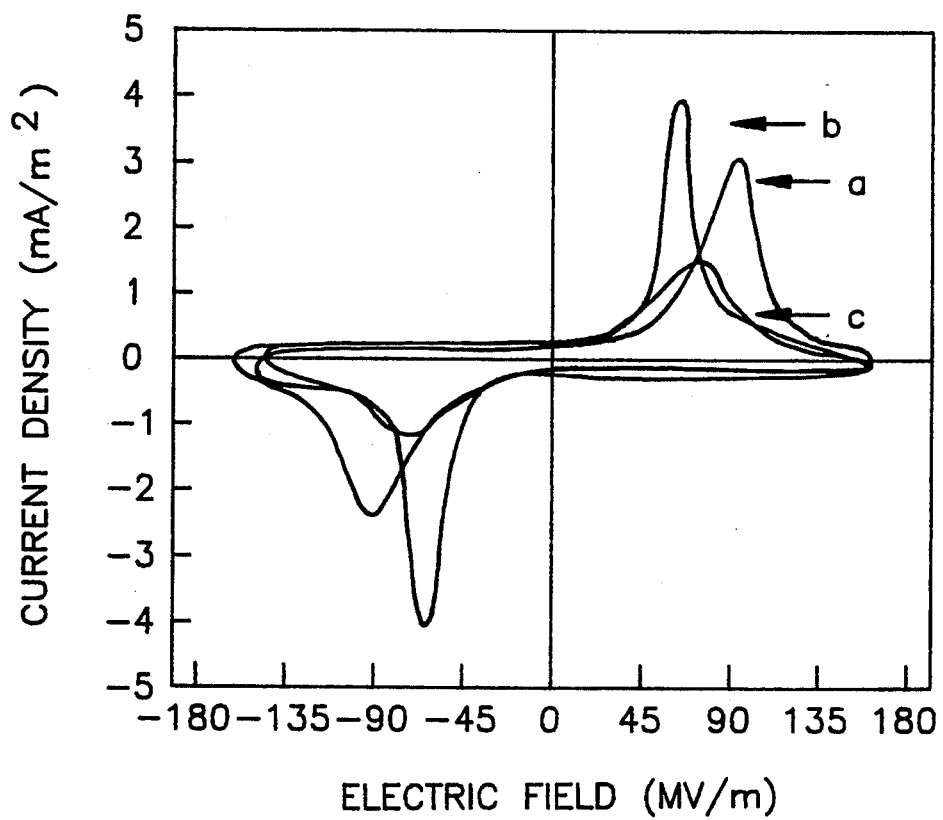
FIGS. 2–33 show properties of the piezoelectric laminate films of the invention and the polymeric films used in making the piezoelectric laminate films.
Figure 3:
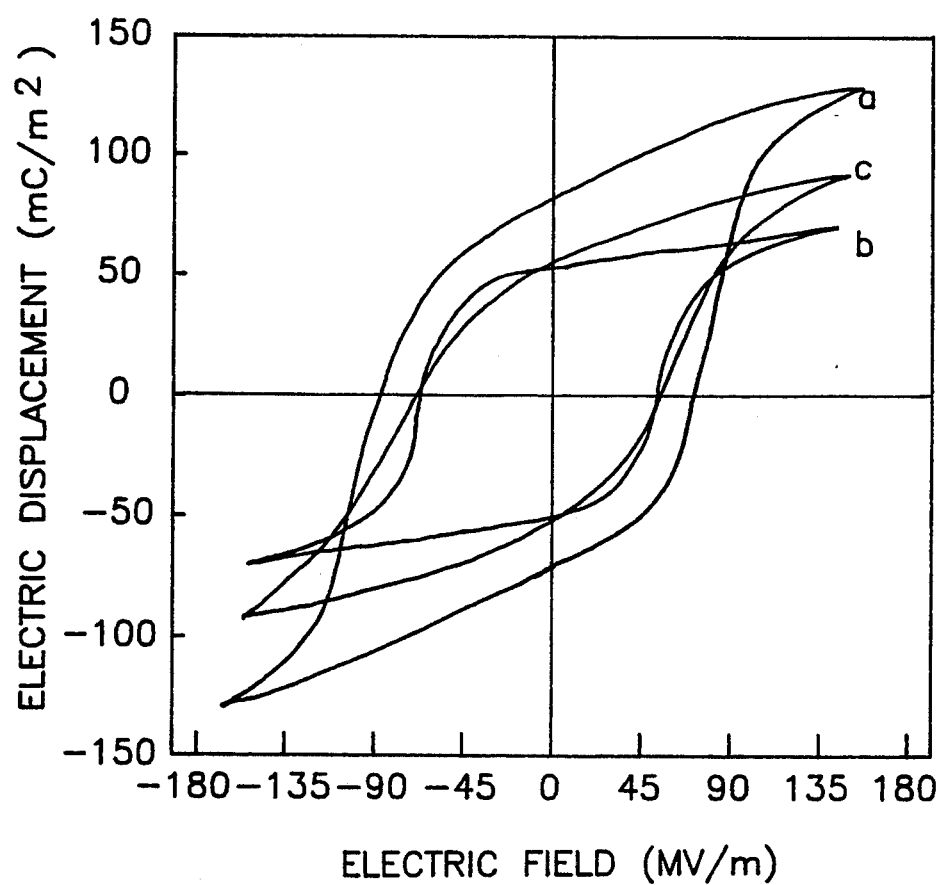

FIG. 2 and FIG. 3 show the current density and electric displacement versus applied electric field characteristics, at room temperature, of Nylon 11, PVF$_2$ and Nylon 11/PVF$_2$ bilaminate films, respectively. The J vs. E curve of the Nylon 11/PVF$_2$ bilaminate shows its clear switching current peak like in the case of individual Nylon 11 or PVF$_2$ film. This indicates that a polarization reversal phenomenon happened under the applied triangular electric field. The position of the current peak shifts to a higher applied electric field and the broadness of the peak is between those of Nylon 11 and PVF$_2$ films.

The D-E characteristics obtained by integrating current density of the curve in FIG. 2 with respect to time are shown in FIG. 3. It is apparent that the Nylon 11/PVF$_2$ bilaminate film exhibits a D-E hysteresis loop, which is always observed in typical ferroelectric materials. The remanent polarization, $P_r$, and the coercive field, $E_c$, by the D-E relation, are about 75 mc/m$^2$ and 64 MV/m, respectively. The remanent polarization, $P_r$, is about 44% higher than that of Nylon 11 or PVF$_2$ produced by identical procedure, which is about 52 mc/m$^2$. The coercive field, $E_c$, is about 22% higher than that of Nylon 11 or PVF$_2$, about 64 MV/m.

Figure 4:
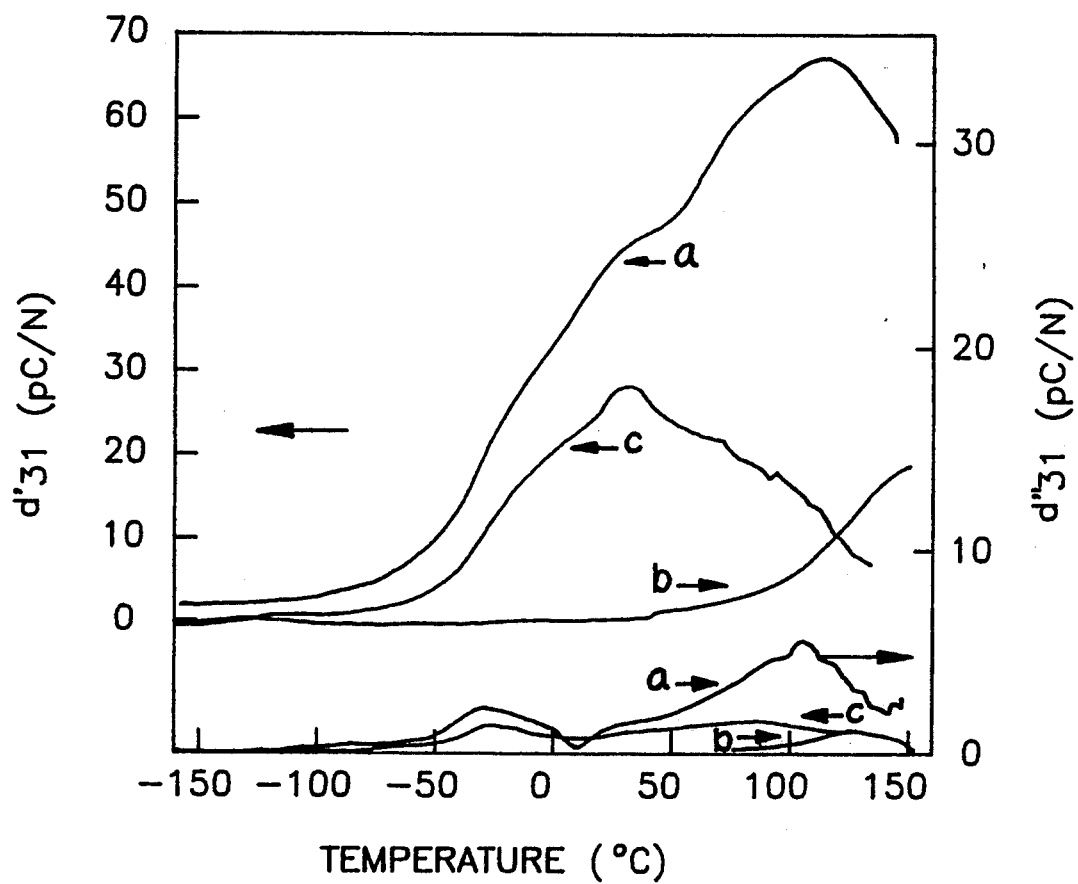
Figure 5:
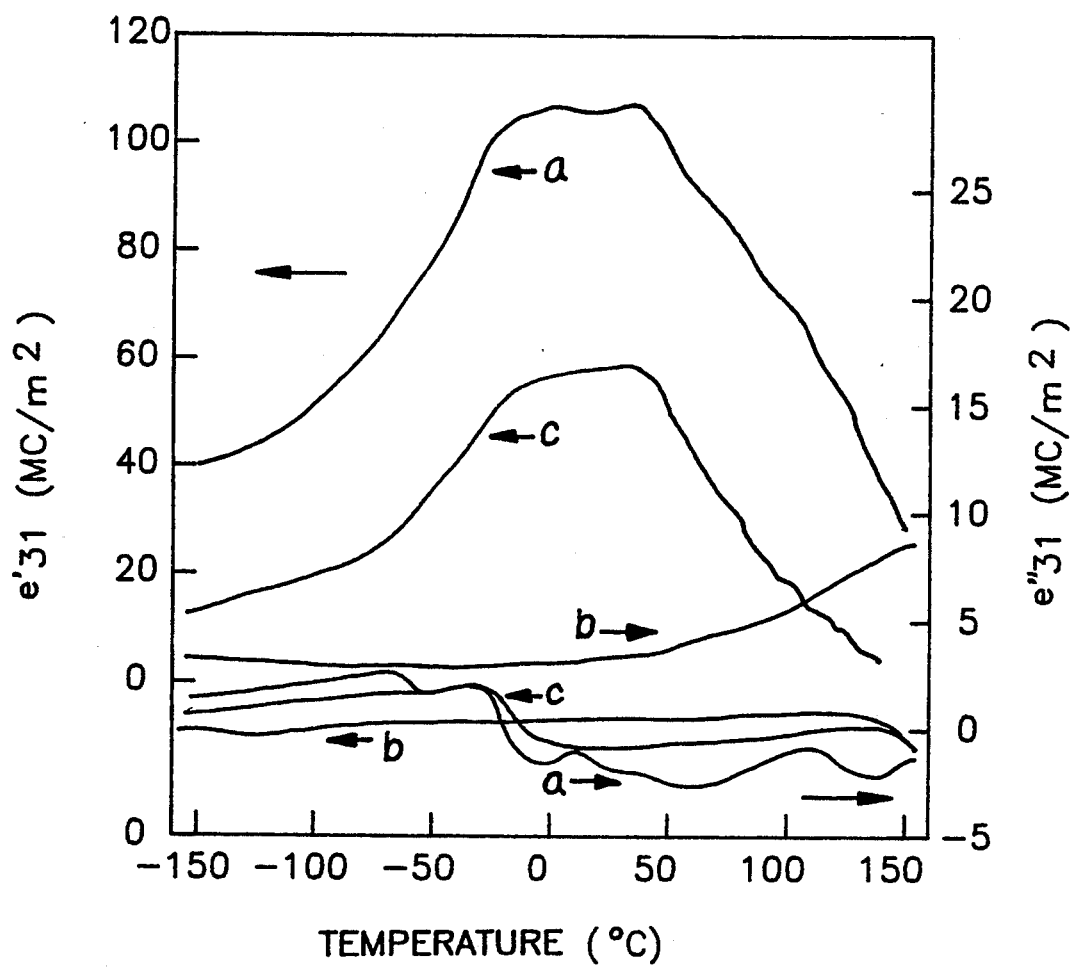

4. Temperature Dependence of Dielectric, Mechanical and Piezoelectric Characteristics FIG. 4 and FIG. 5 show the temperature dependence of piezoelectric stress constant, $d_{31}$ and piezoelectric strain constant, $e_{31}$, while the temperature dependence of Young's modulus, C and dielectric constant, $\epsilon$ are being shown in FIG. 6 and FIG. 7. The significant enhancement of piezoelectric properties in the case of Nylon 11/PVF$_2$ bilaminate can be readily noted at both room and elevated temperatures. At room temperature, the value of $d_{31}$ of the bilaminate is 40.9 pc/N, which is 61.7% higher and more than 133% higher than the values of PVF$_2$ (25.3 pc/N) and Nylon 11 (2.86 pc/N), measured under the identical conditions, respectively.

When the temperature is increased, $d_{31}$ of the bilaminate film reaches its maximum at about $100°$ C. 63 pc/N, which is more than five times that of PVF$_2$ (about 11 pc/N) and more than about seven times that of Nylon 11 (about 9 pc/N) at the same temperature. The piezoelectric stress constant, $e_{31}$, also shows significant improvement. The value of $e_{31}$ for the bilaminate at room temperature is 109.4 mc/m$^2$, which is about two times that of PVF$_2$ (59.3 mc/m$^2$) and about 18 times that of Nylon 11 (6.15 mc/m$^2$), respectively. When the temperature is elevated the decrease of $e_{31}$ of PVF$_2$ is faster than that of the bilaminate (a shoulder-like shape can be observed in the case of the bilaminate), while $e_{31}$ of Nylon 11 increases with the increment of the temperature. The bilaminate shows an improvement of $e_{31}$ property over that of Nylon 11.

Figure 6:
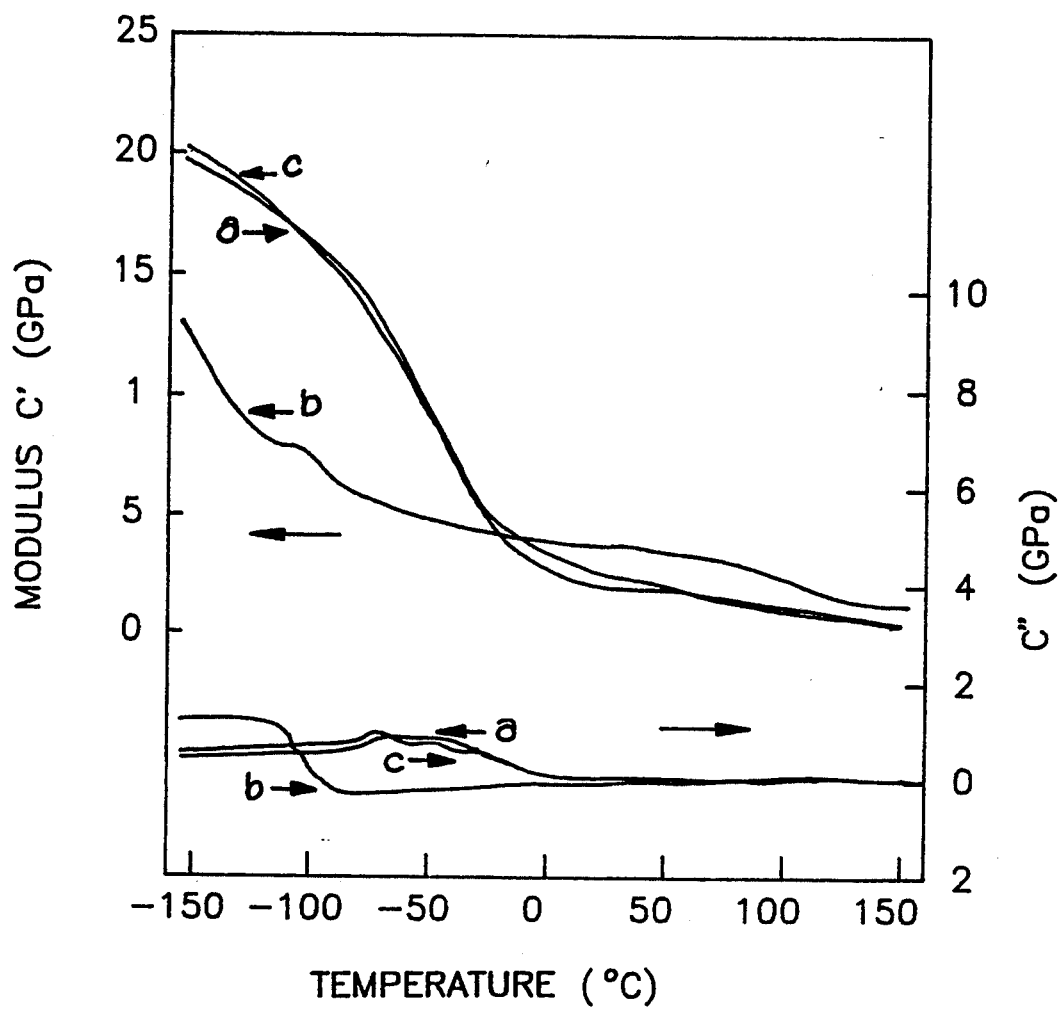
Figure 7:
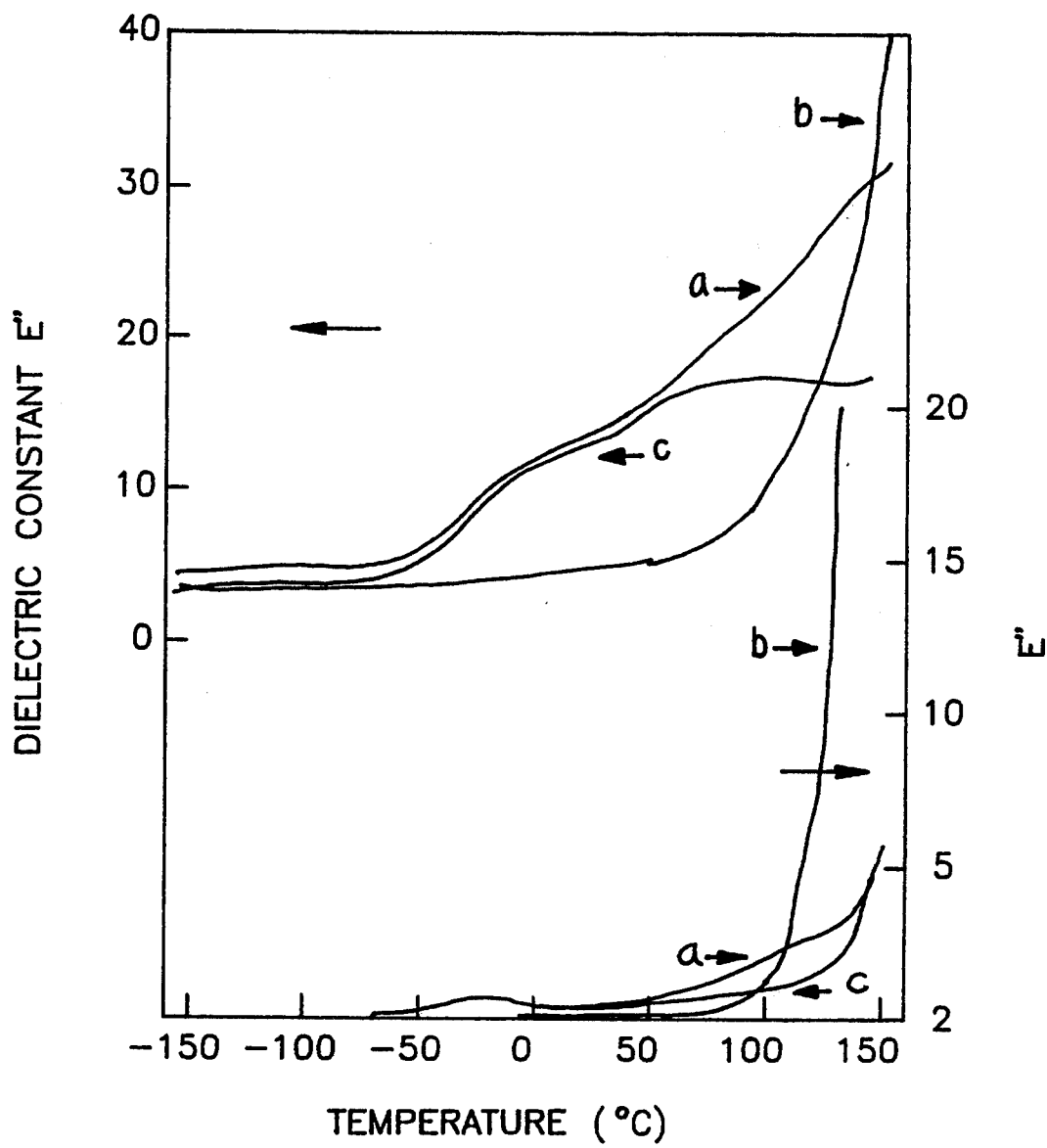
Figure 8:
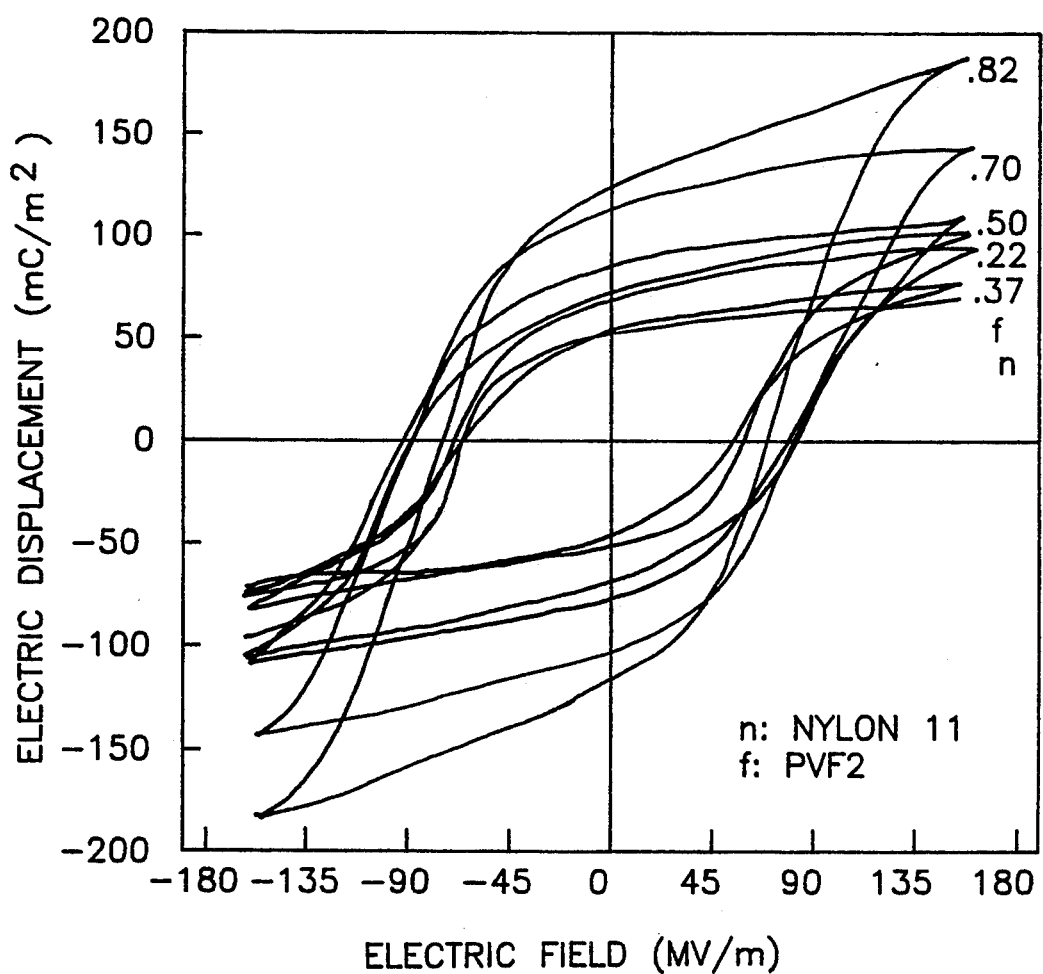
Figure 9:
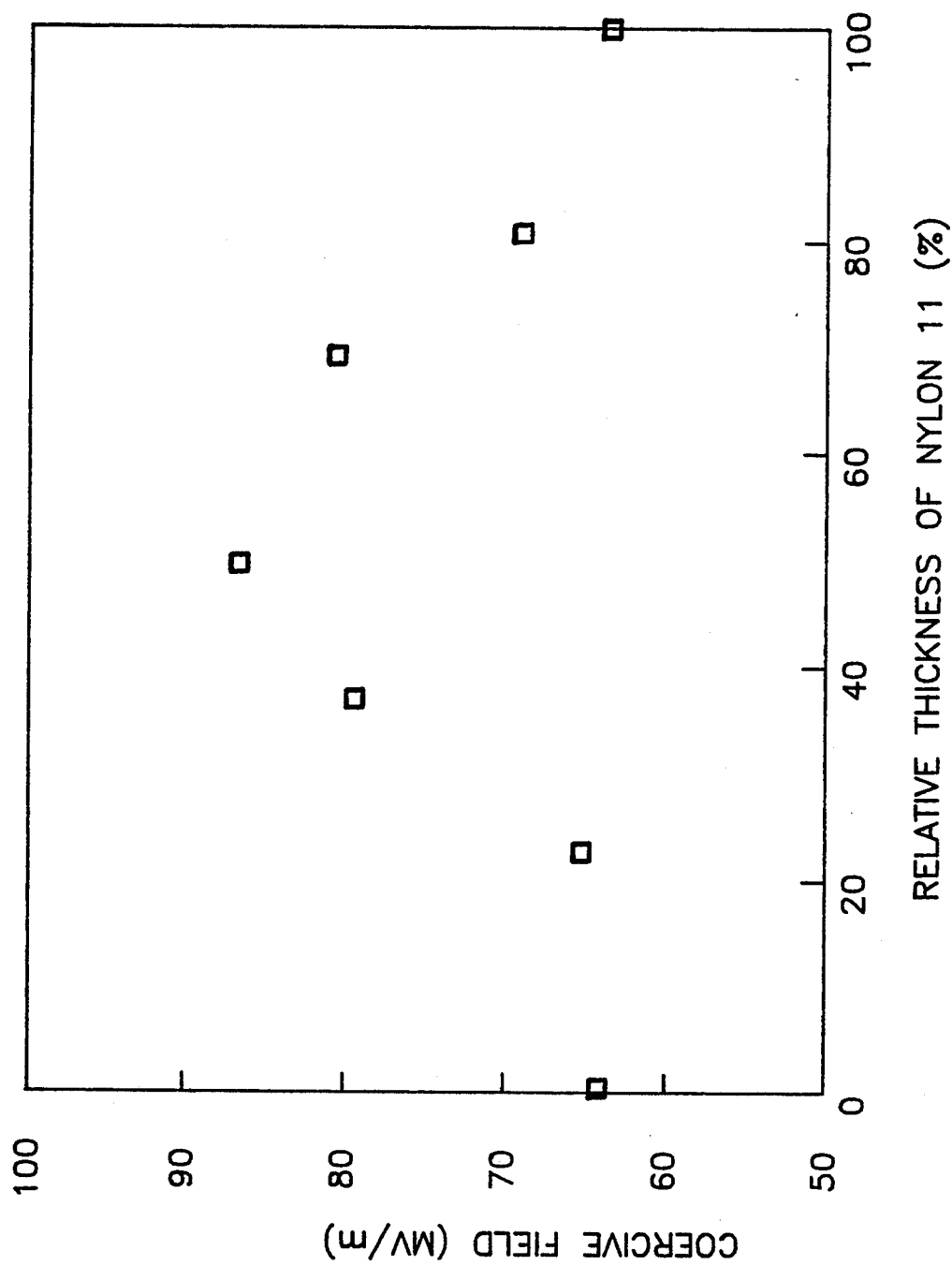
Figure 10:
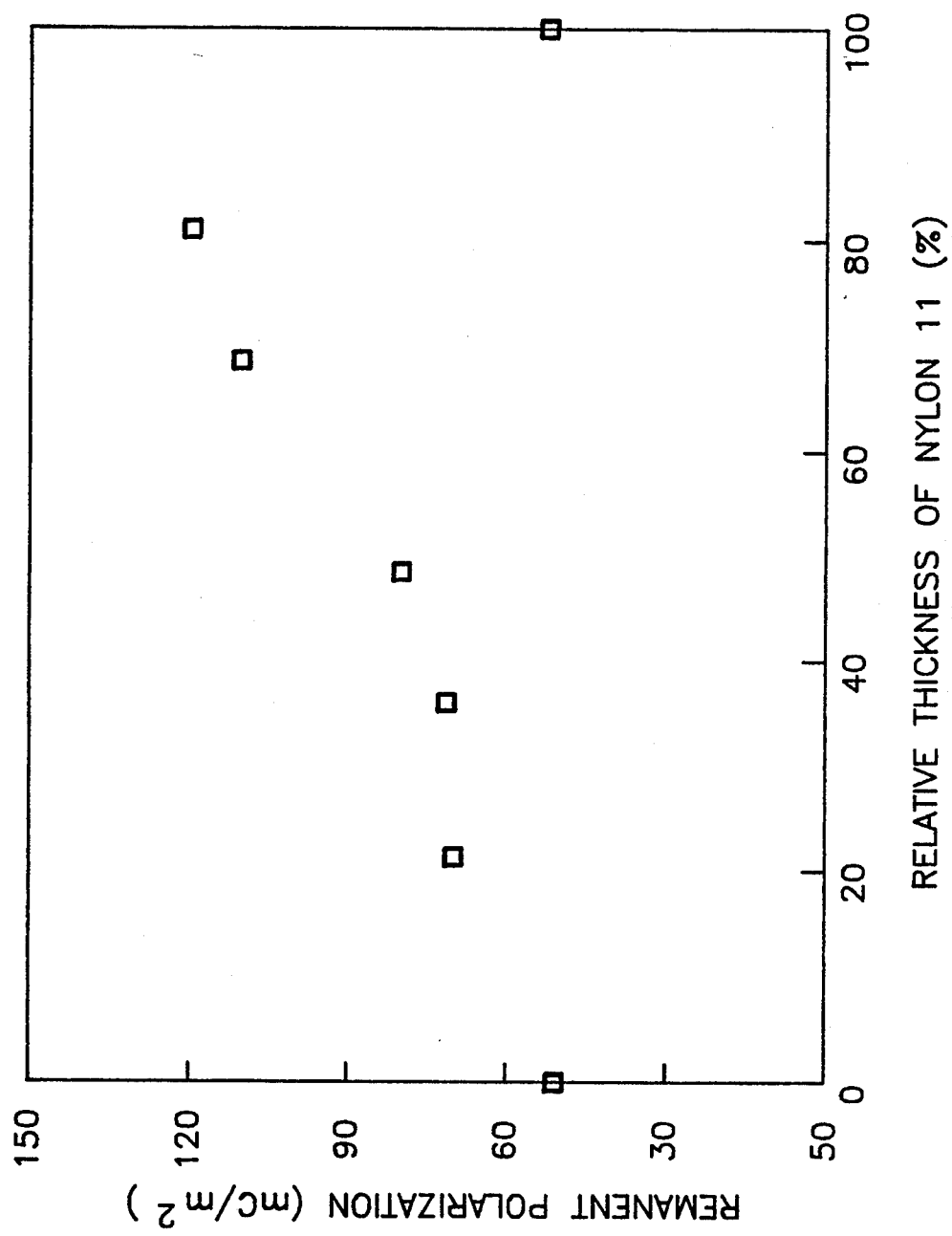
Figure 11:
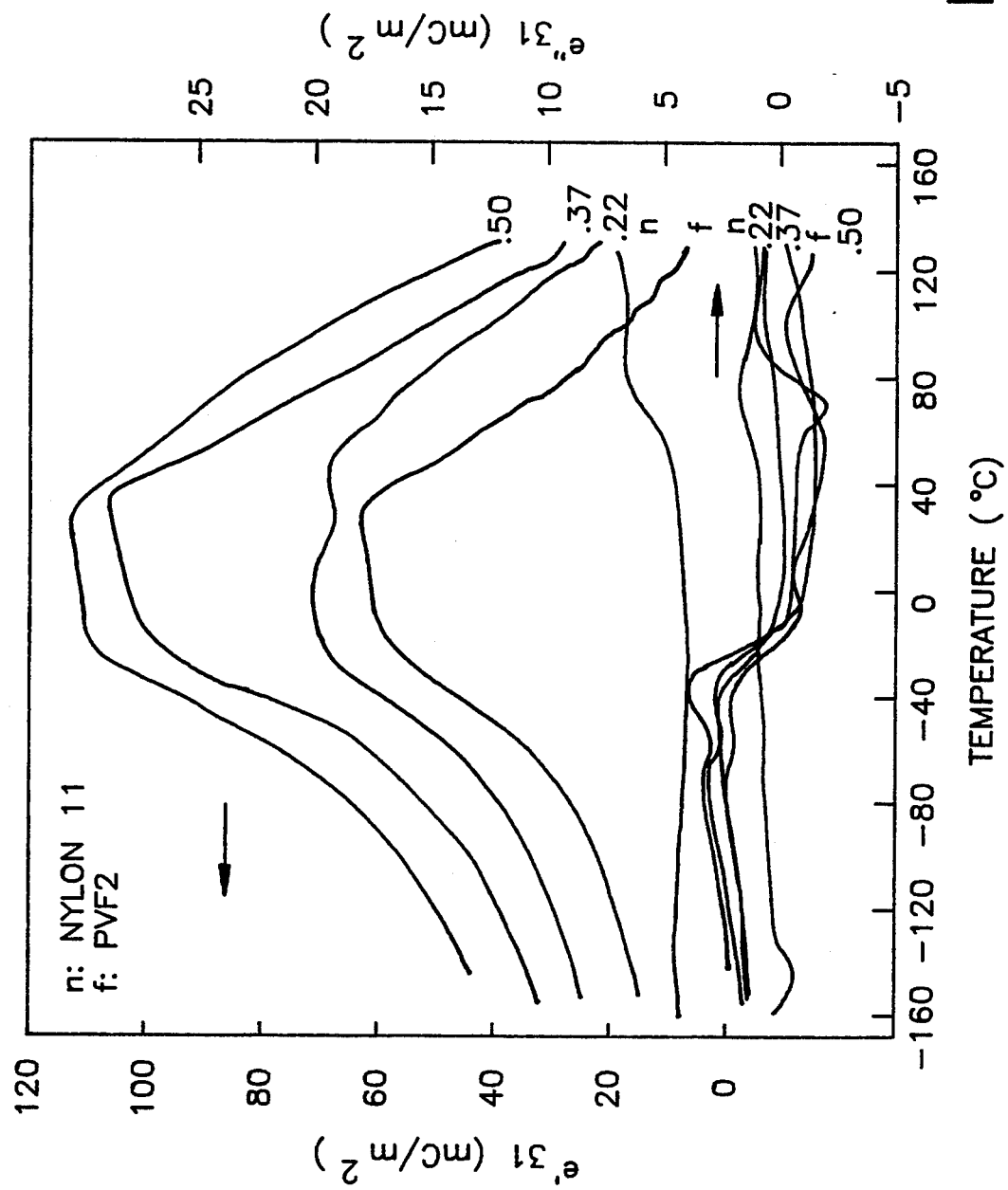
Figure 12:
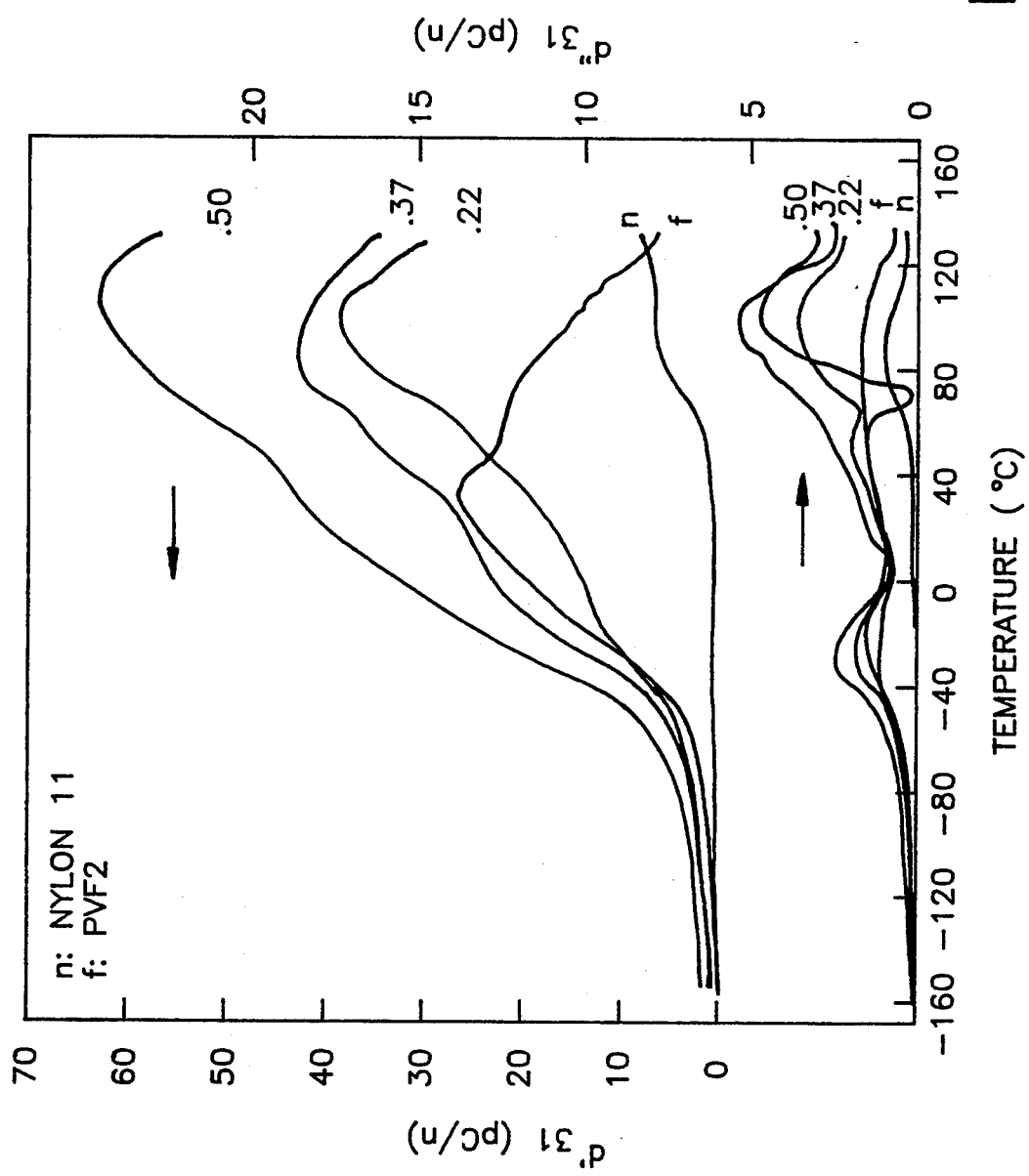
Figure 13:
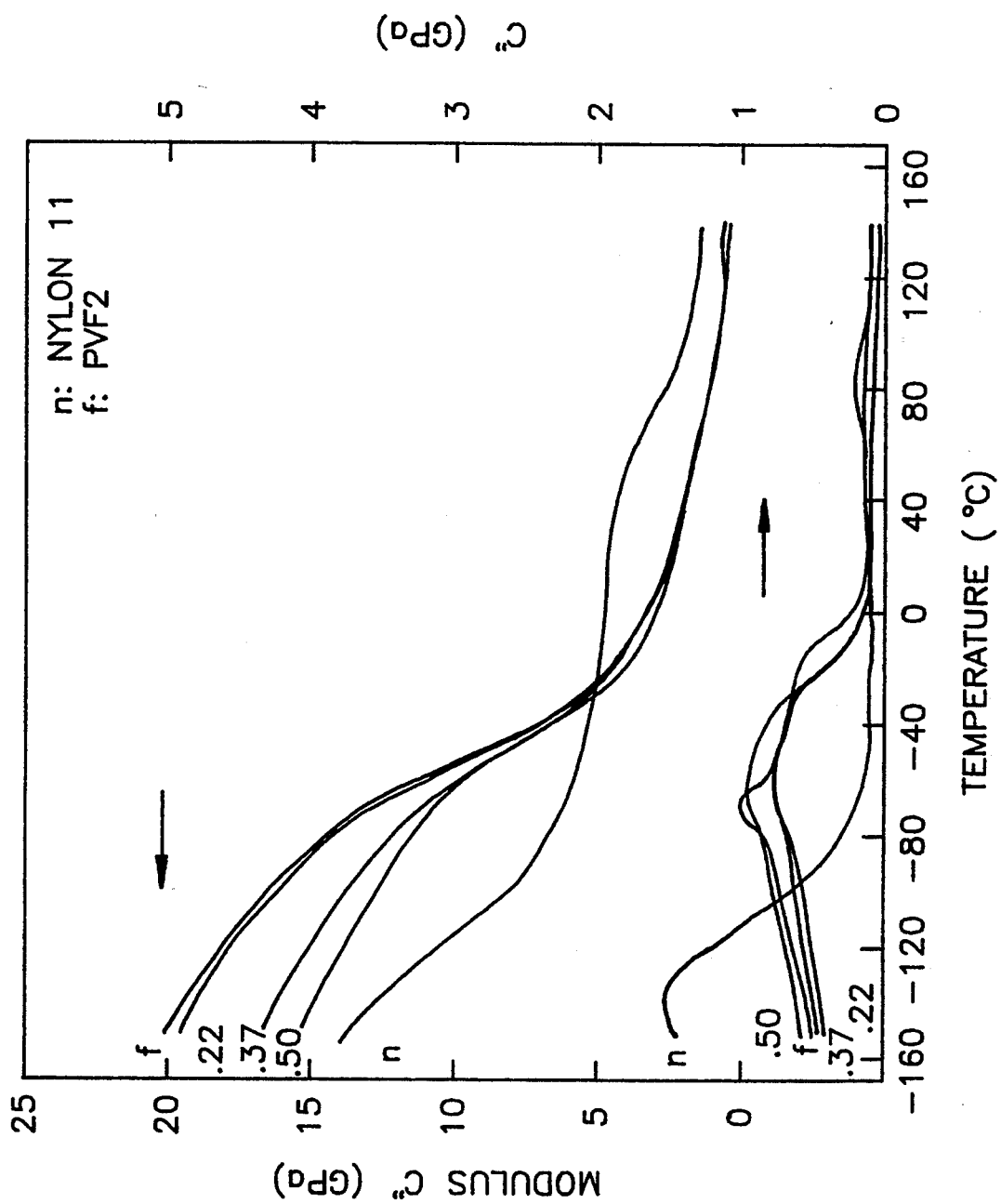
Figure 14:
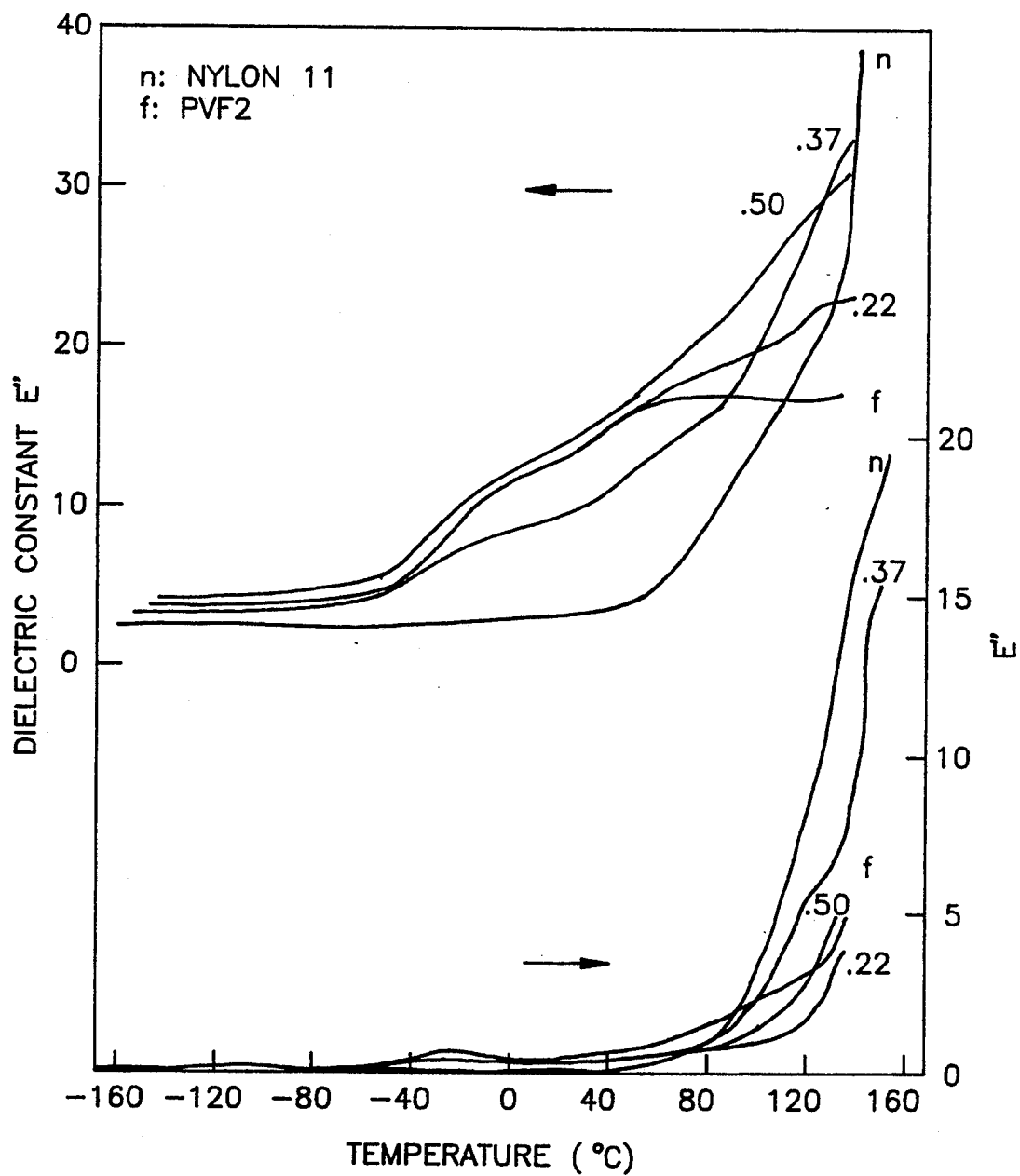
Figure 15:
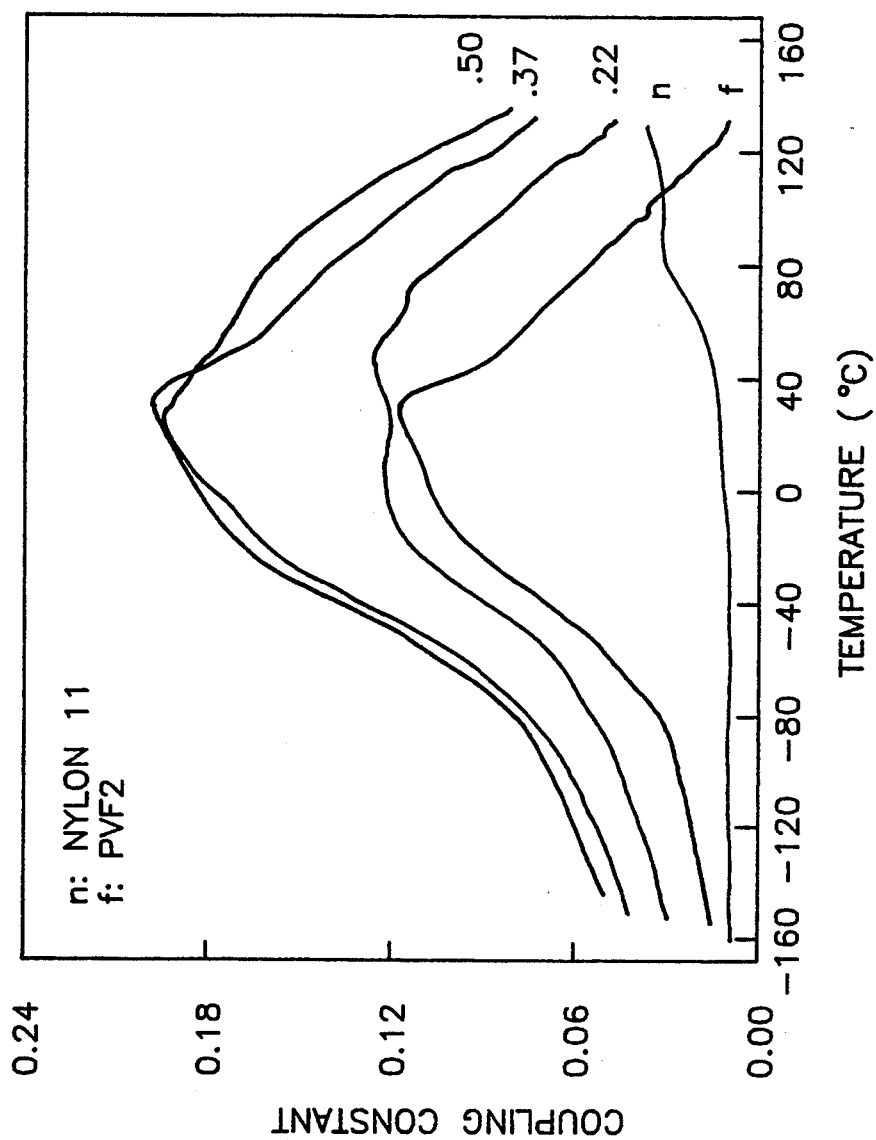
Figure 16:
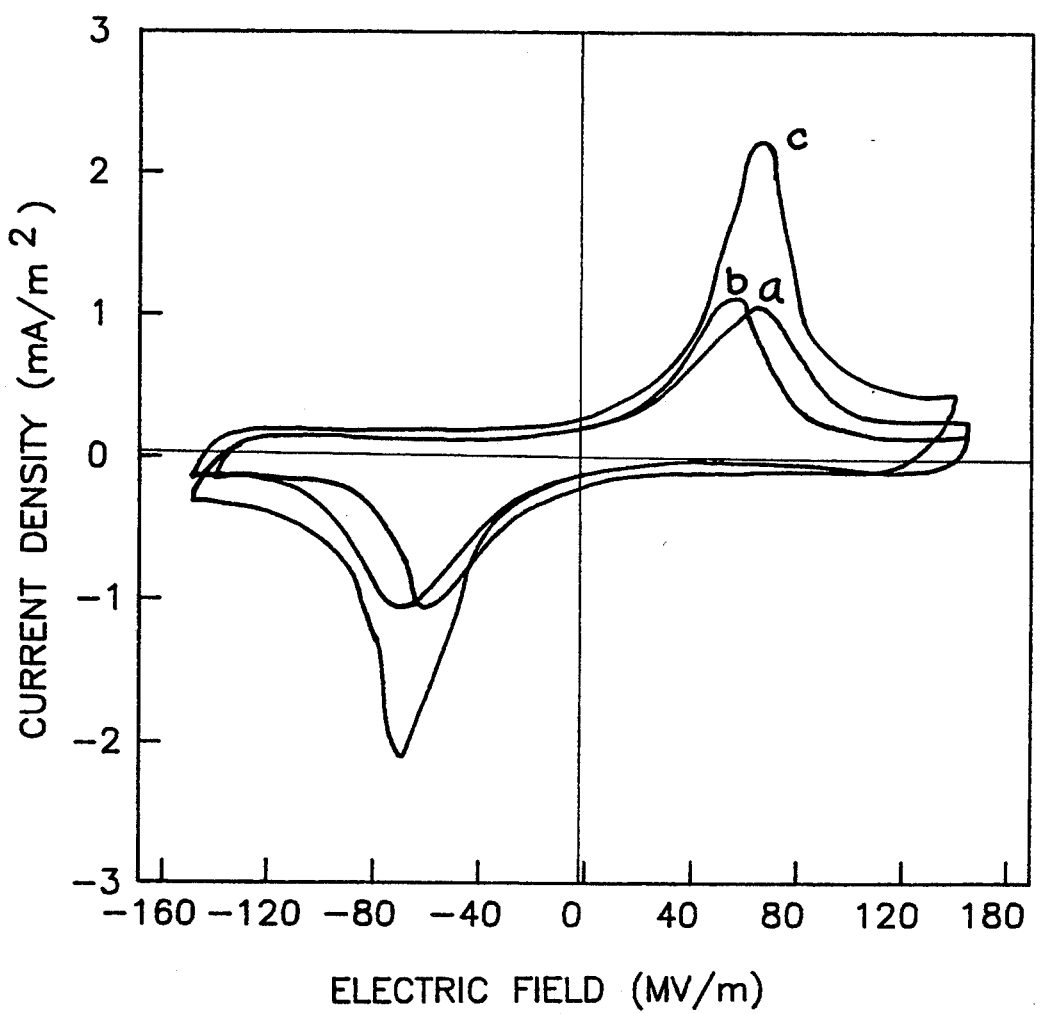
Figure 17:
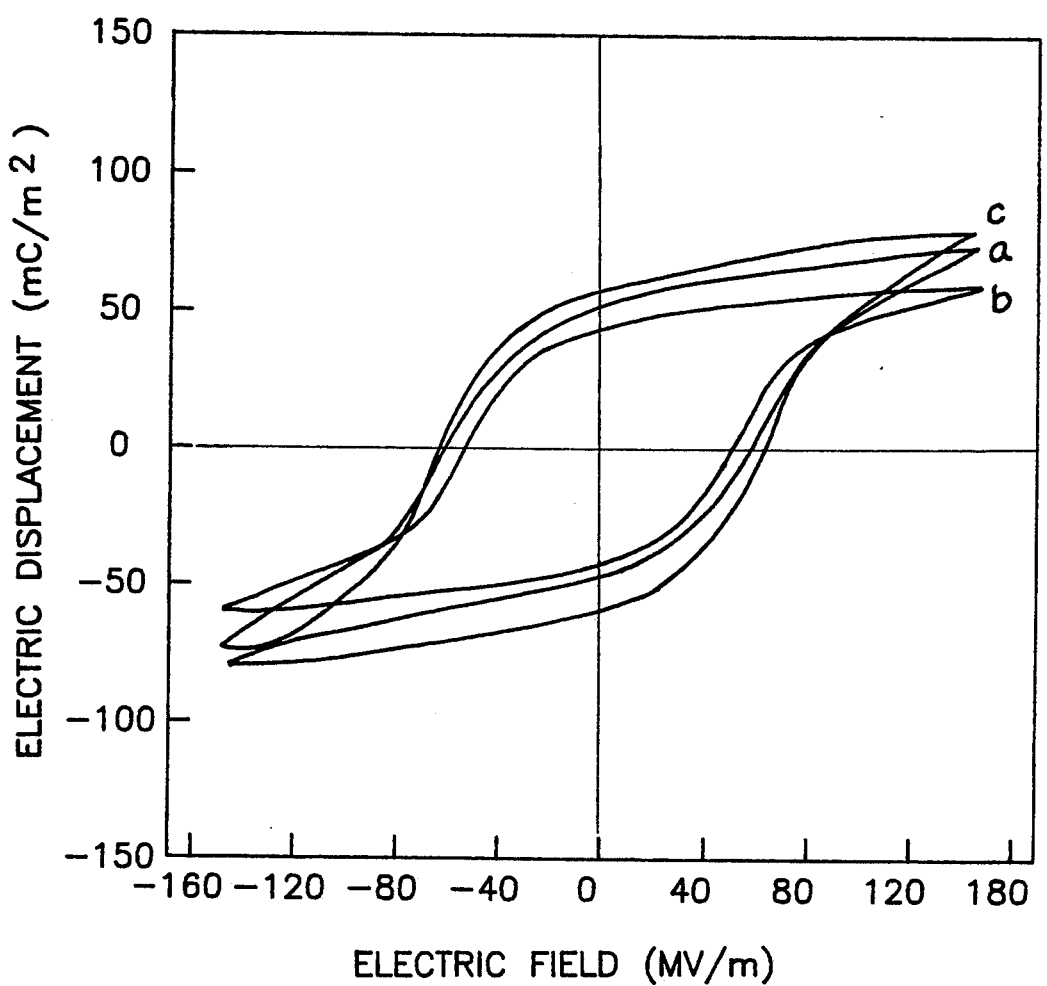
Figure 18:
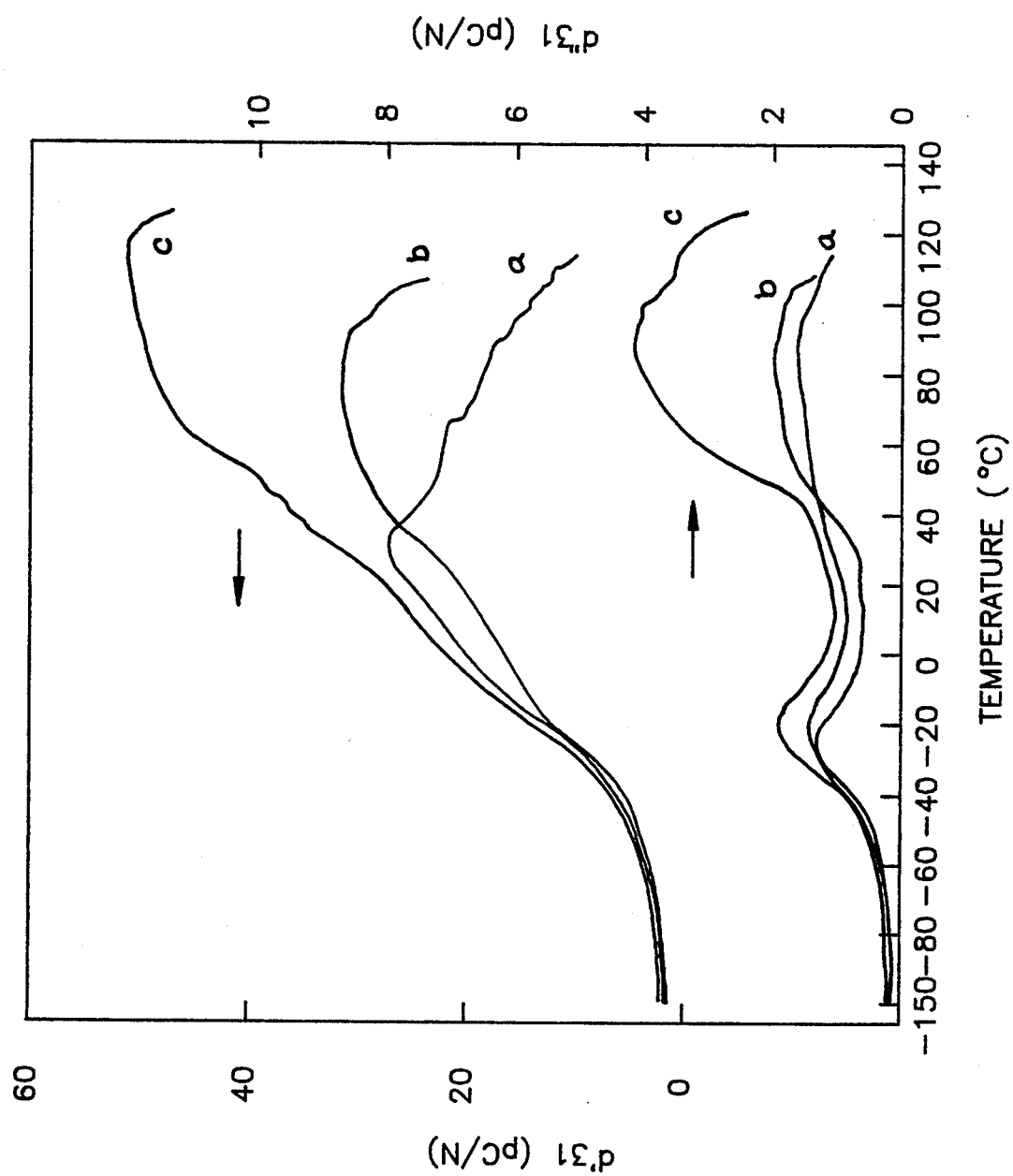
Figure 19:
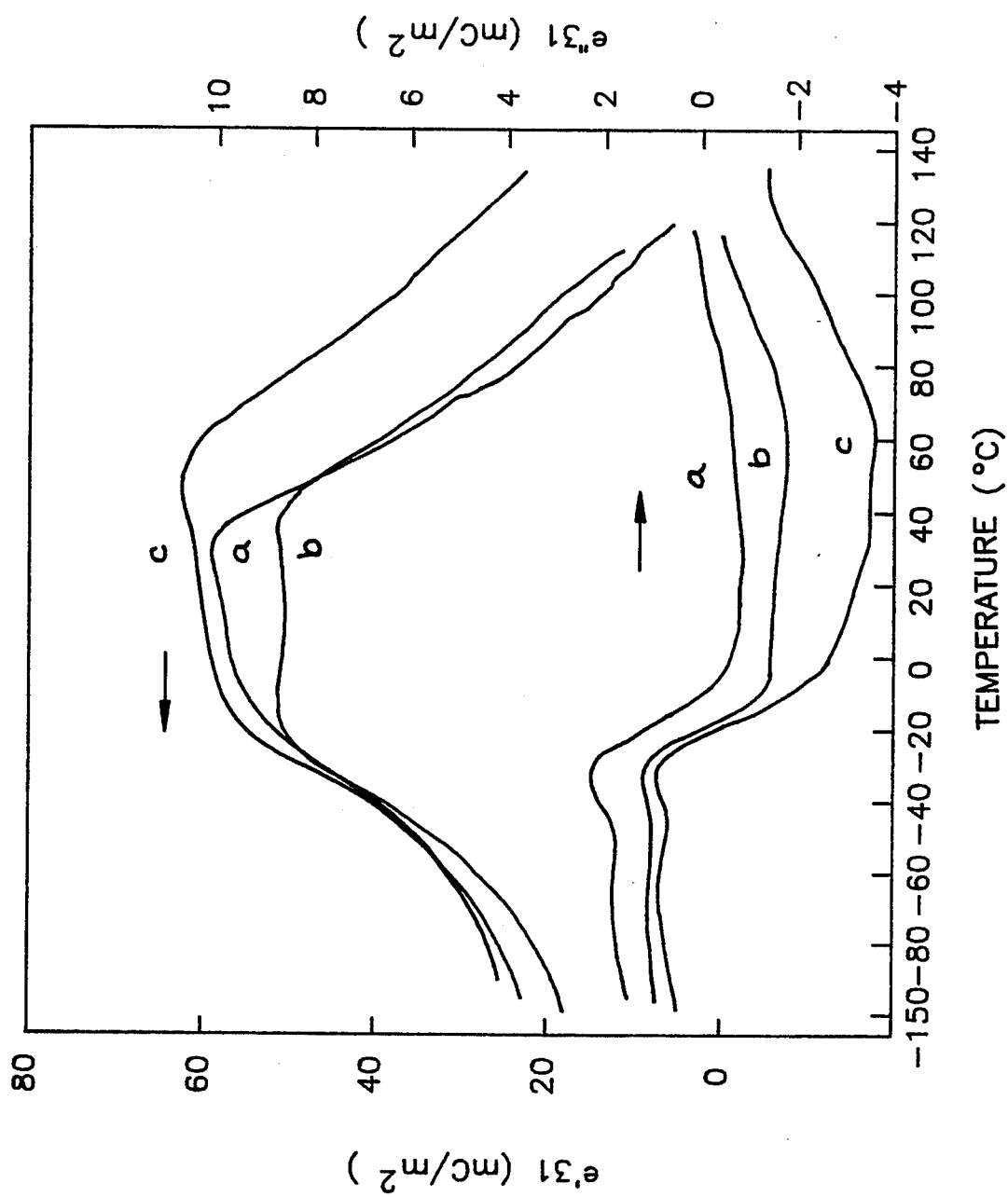
Figure 20:
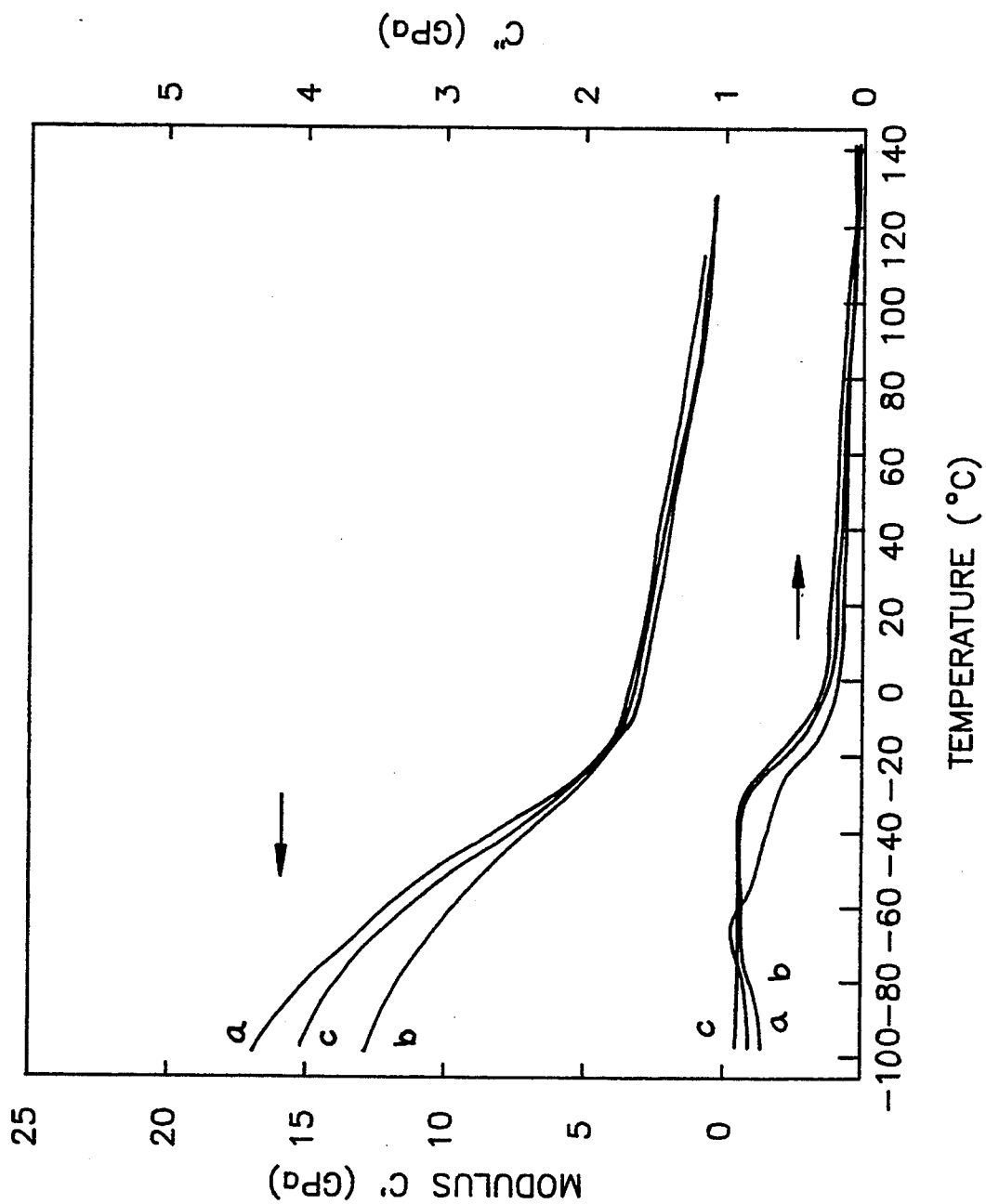
Figure 21:
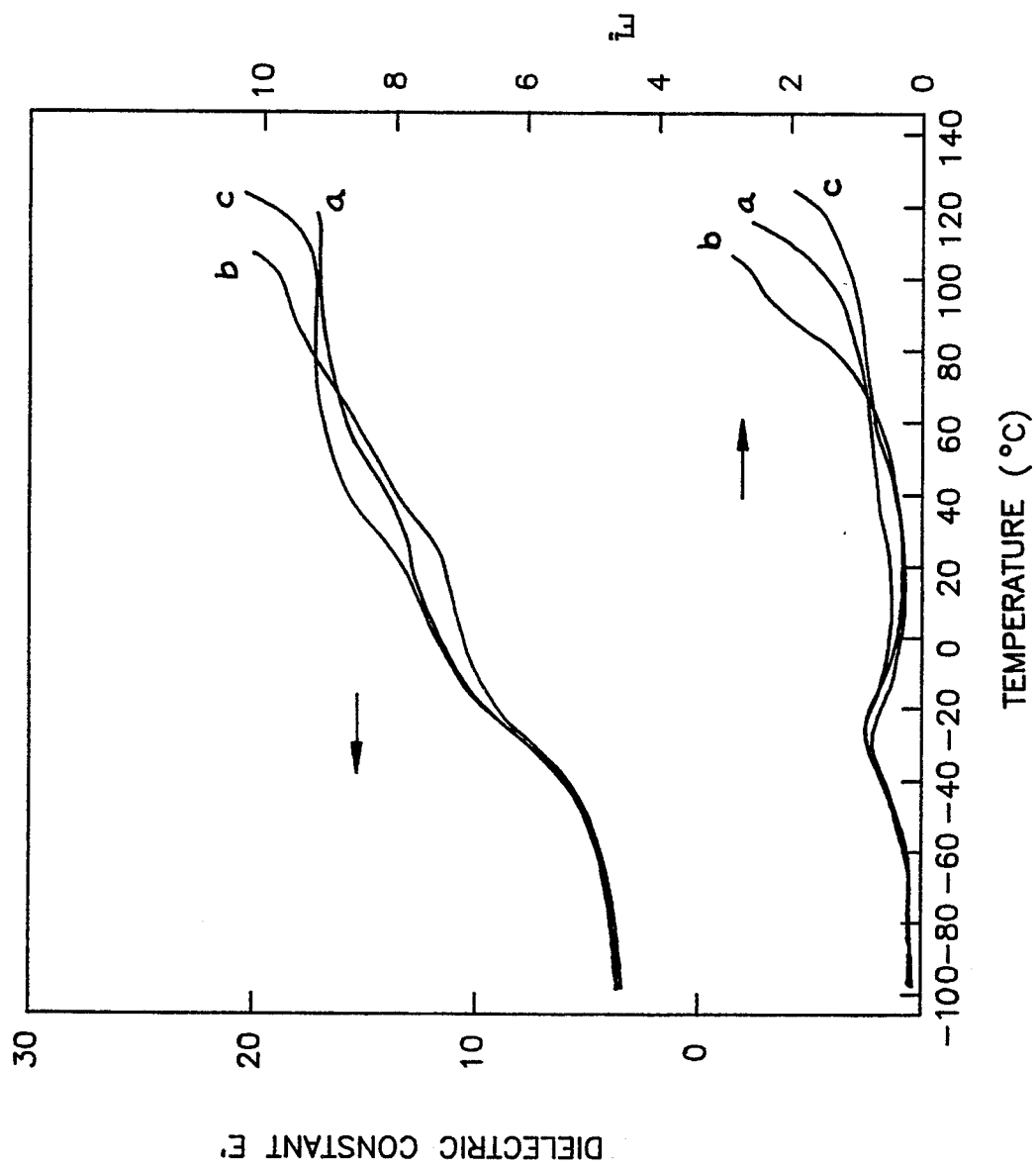
Figure 22:
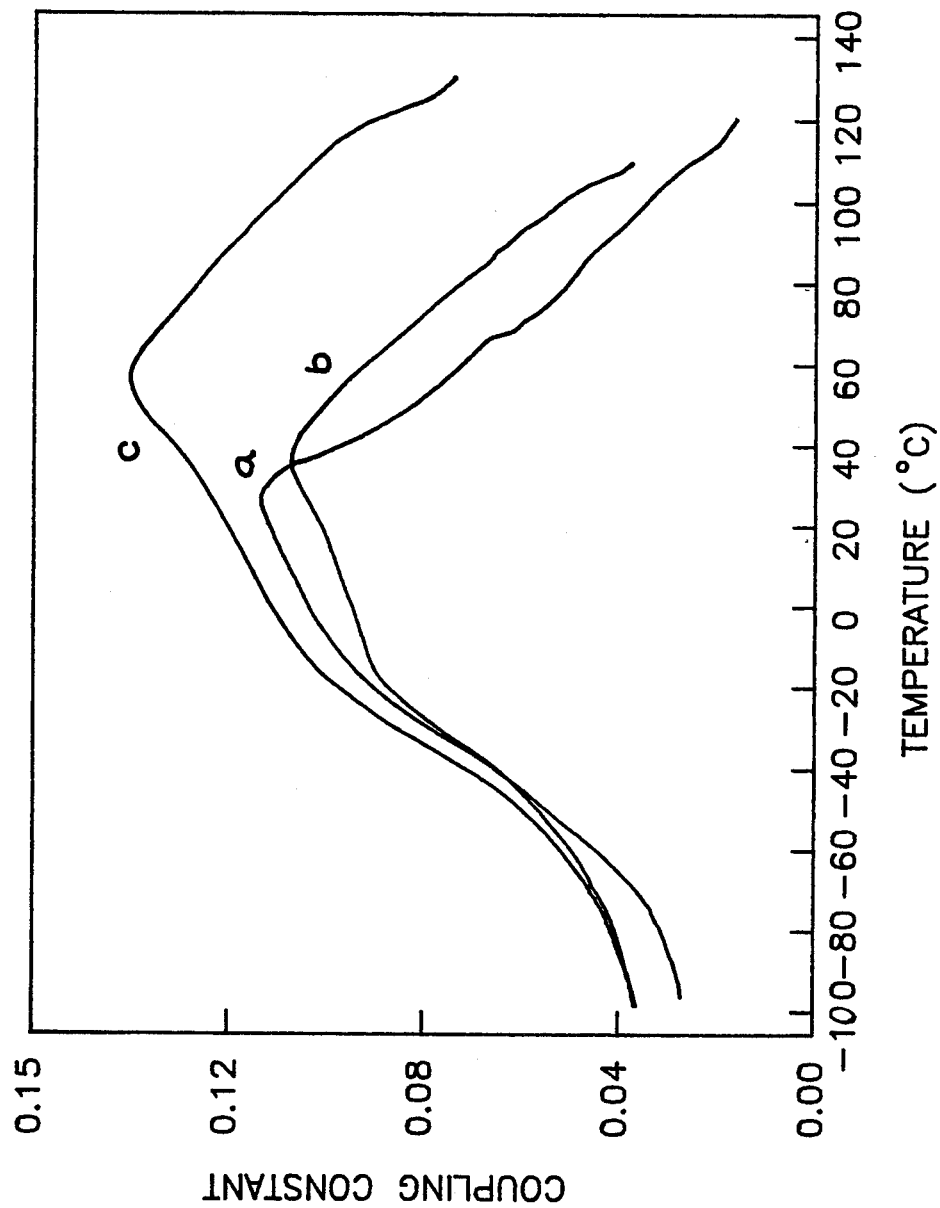
Figure 23:
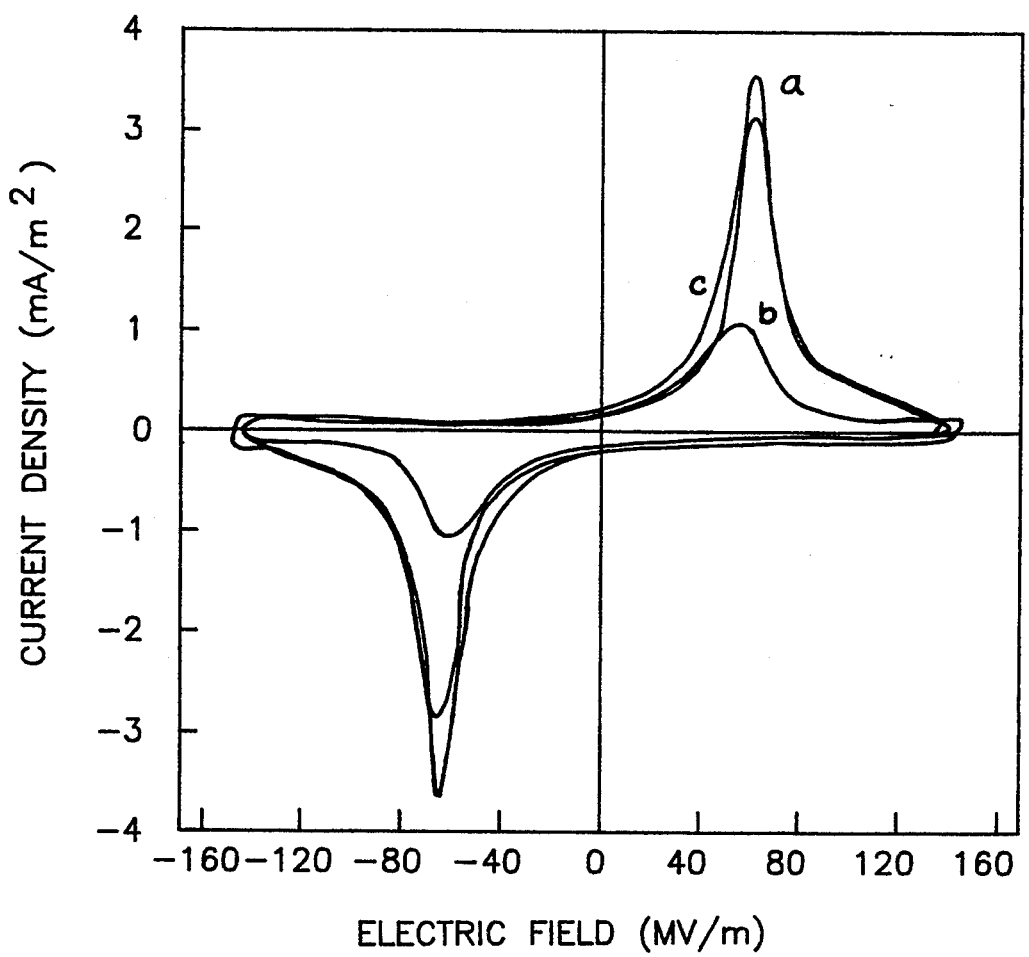
Figure 24:
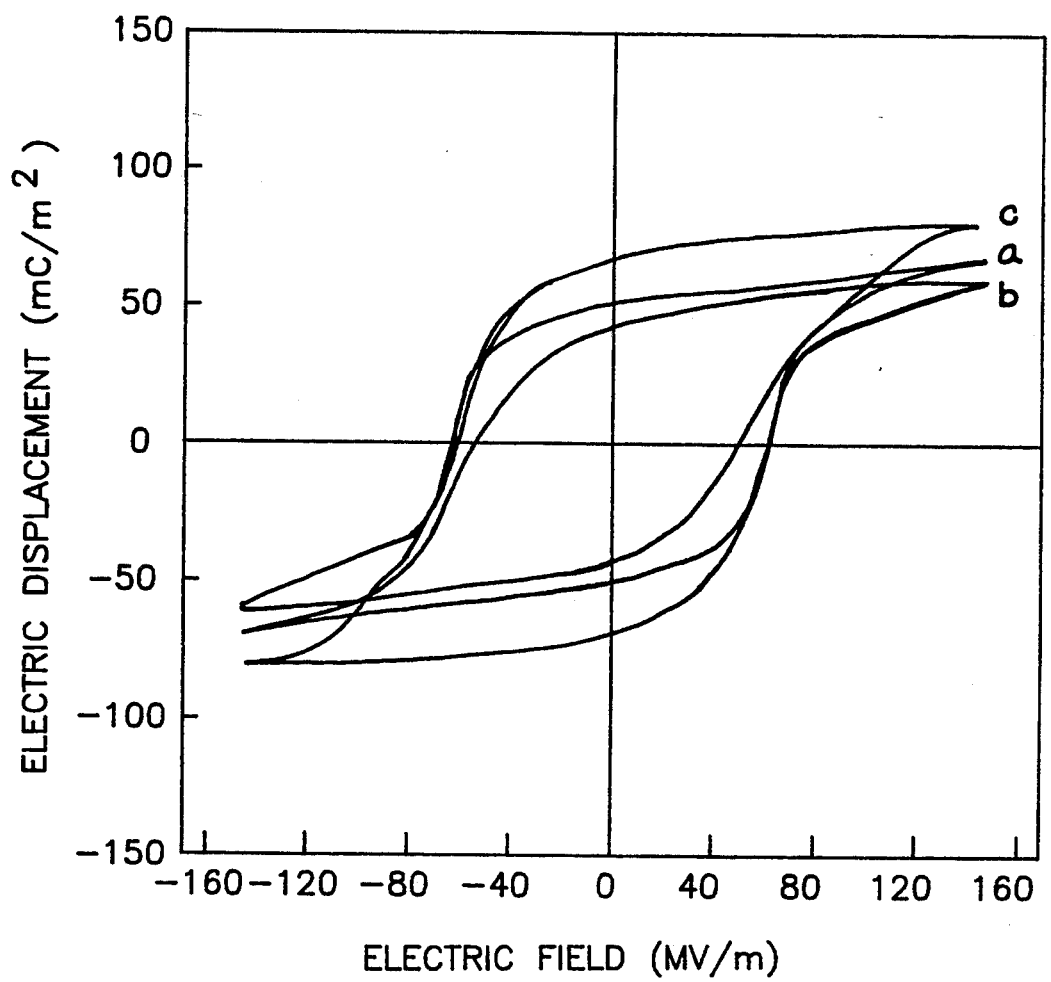
Figure 25:
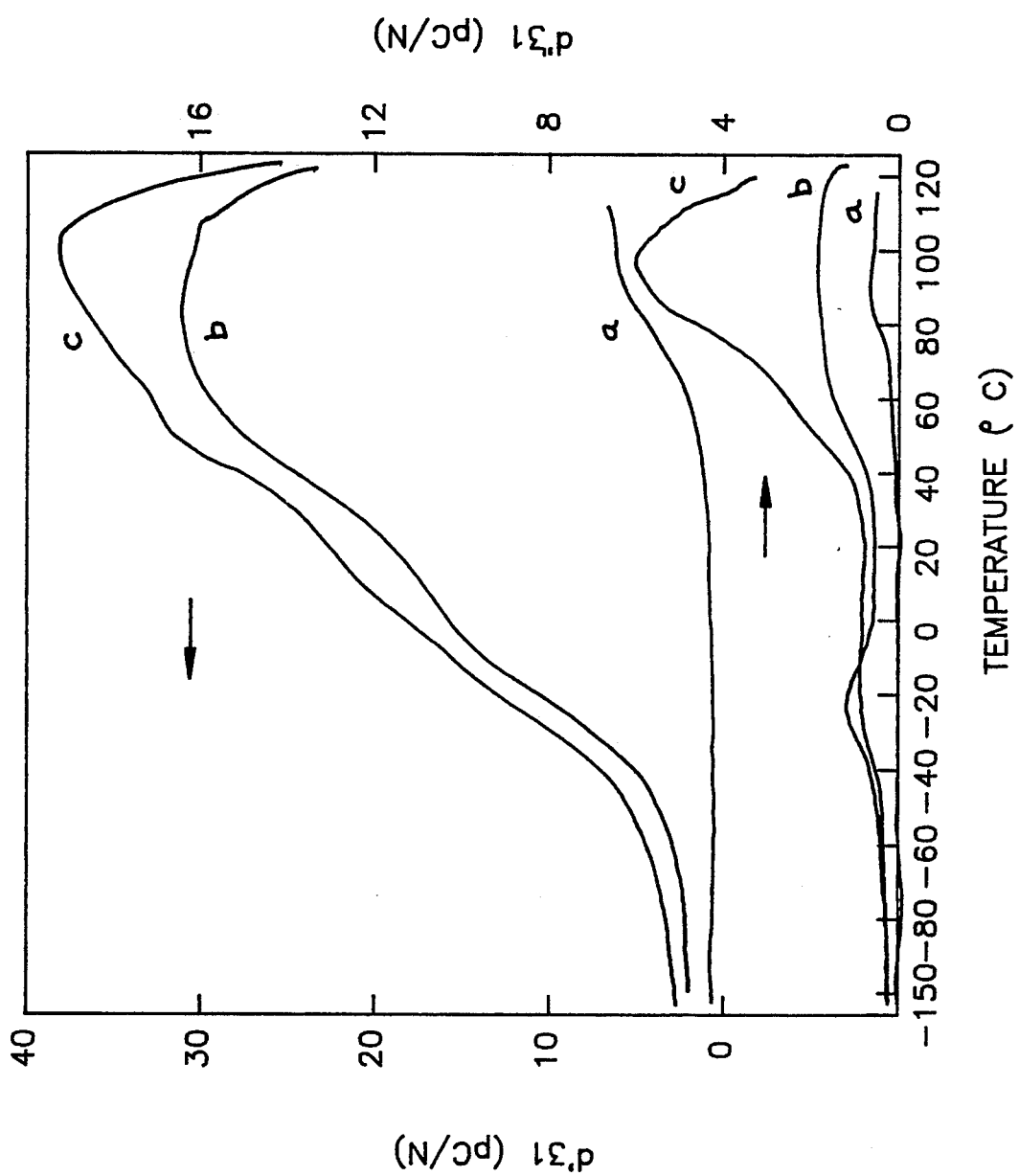
Figure 26:
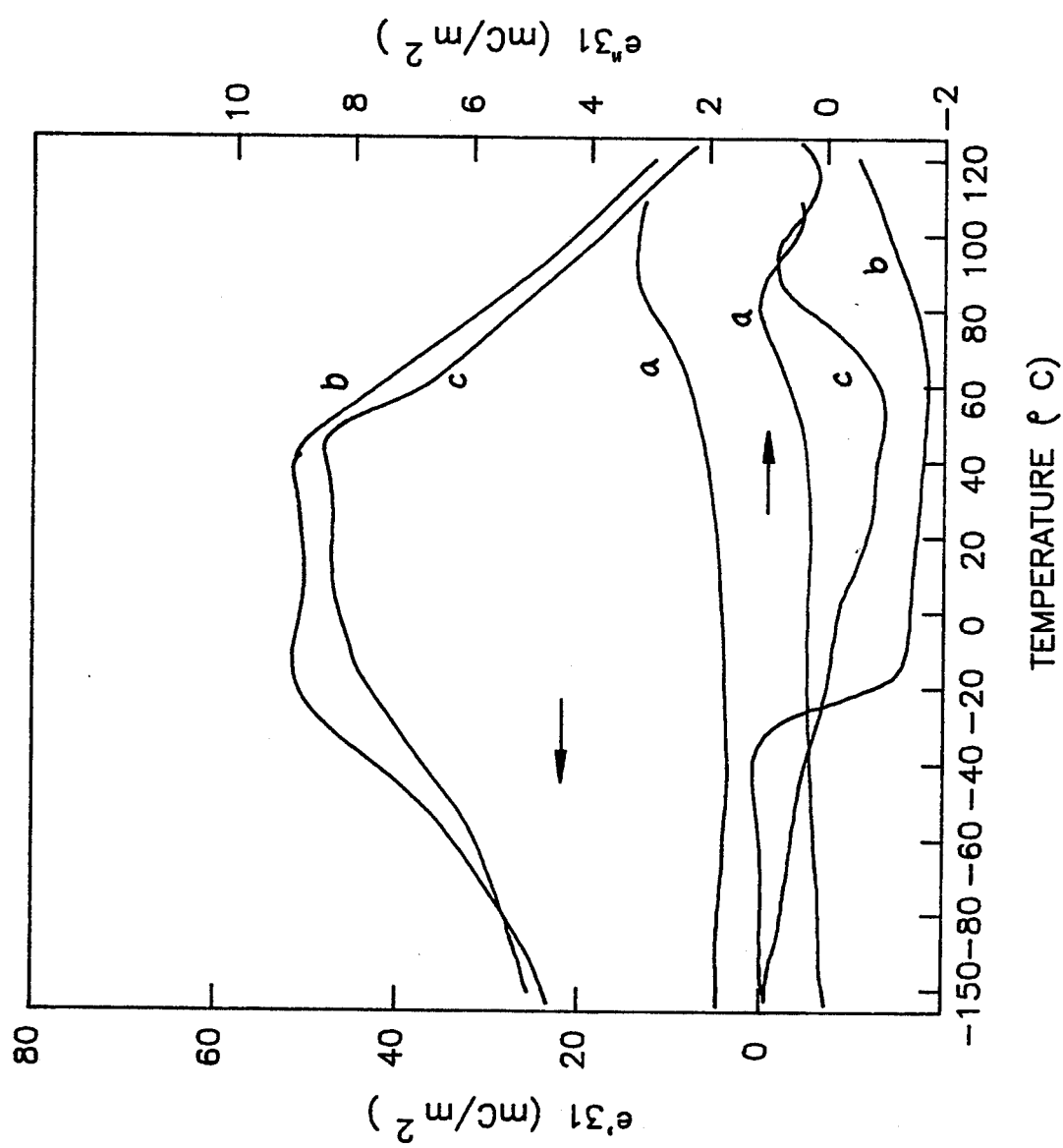
Figure 27:
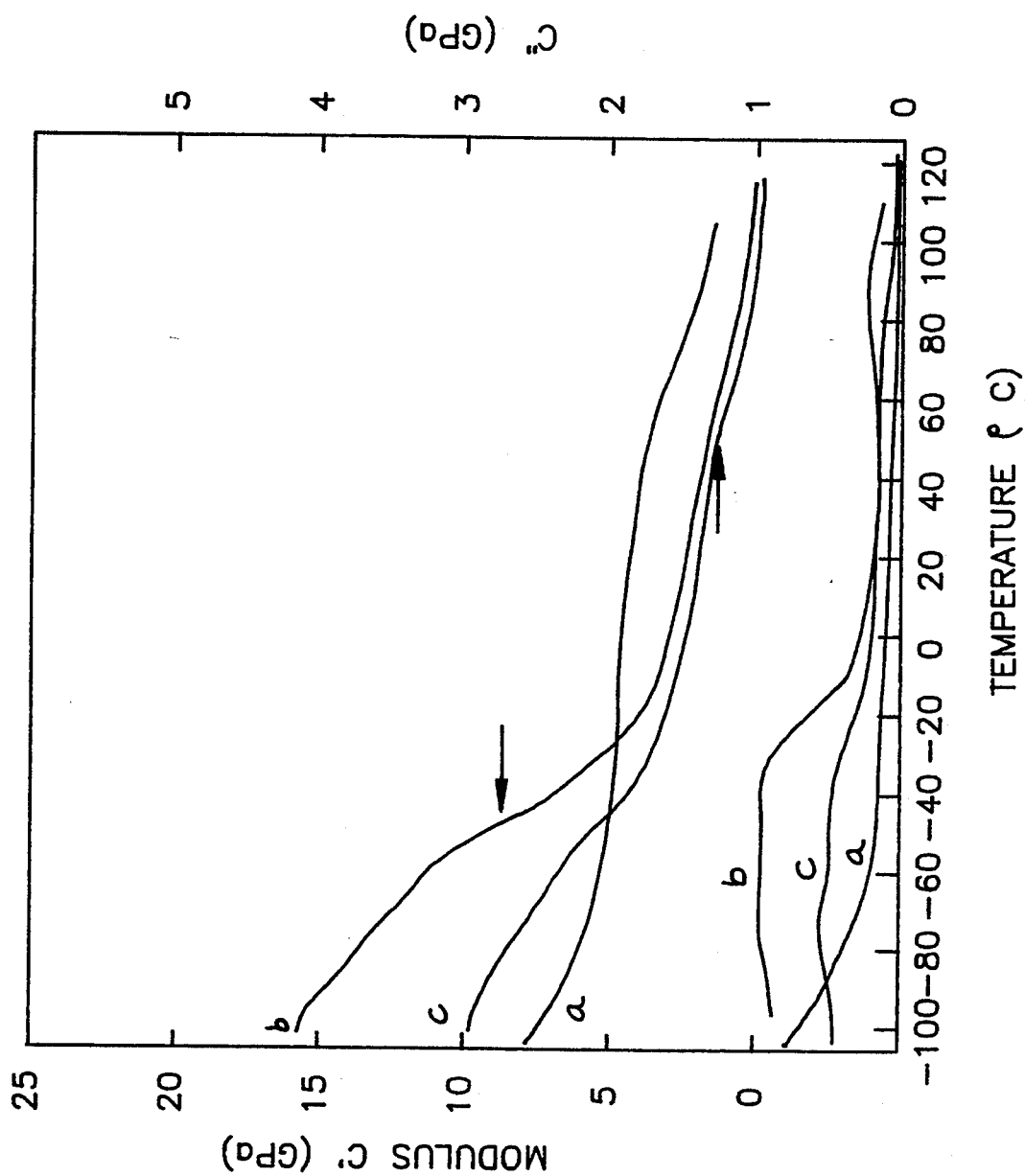
Figure 28:
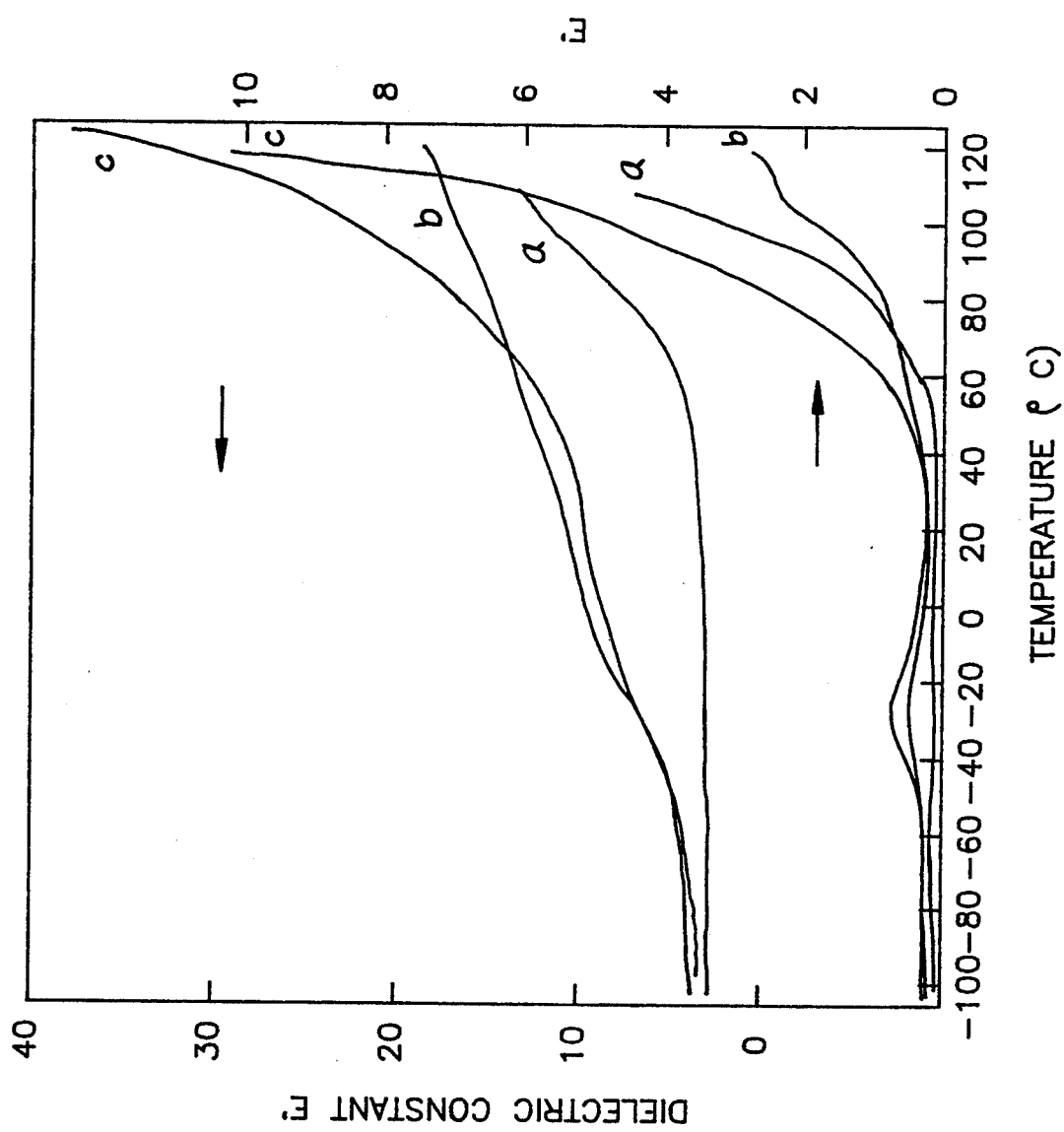
Figure 29:
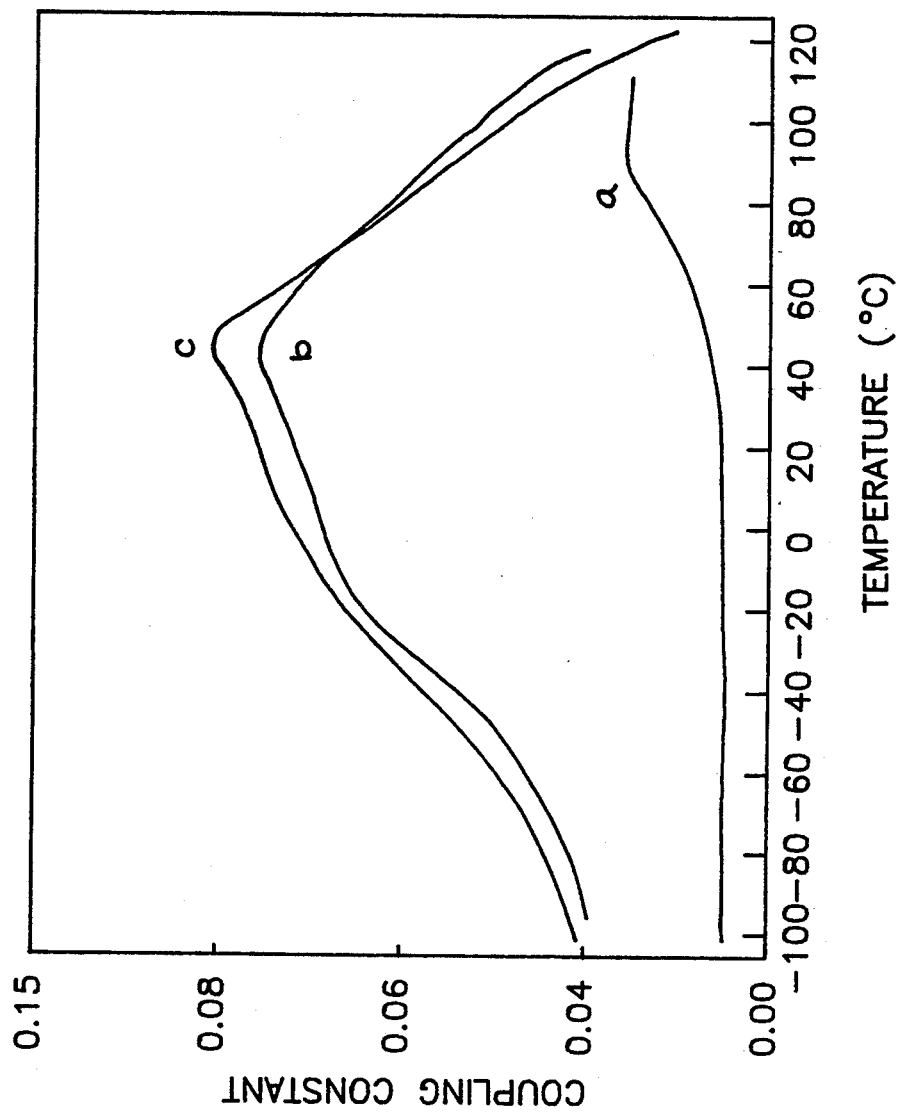
Figure 30:
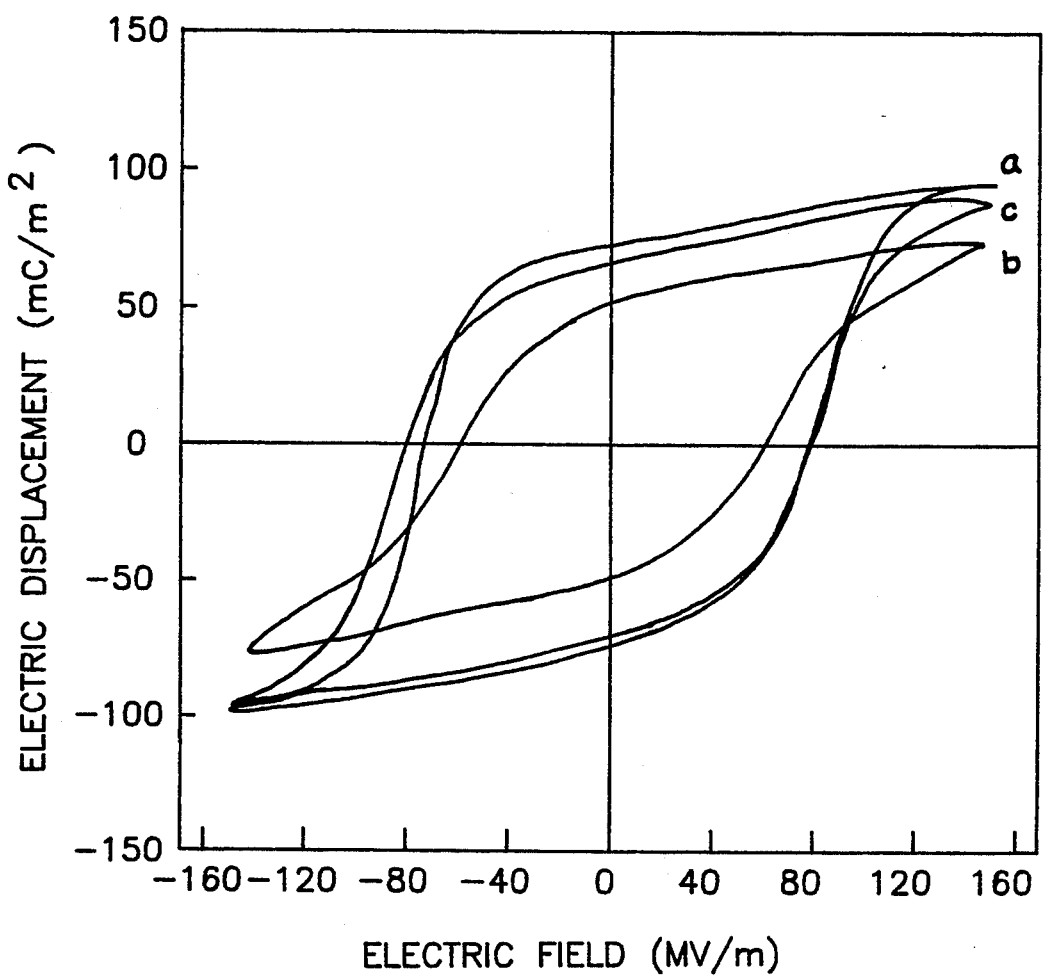
Figure 31:
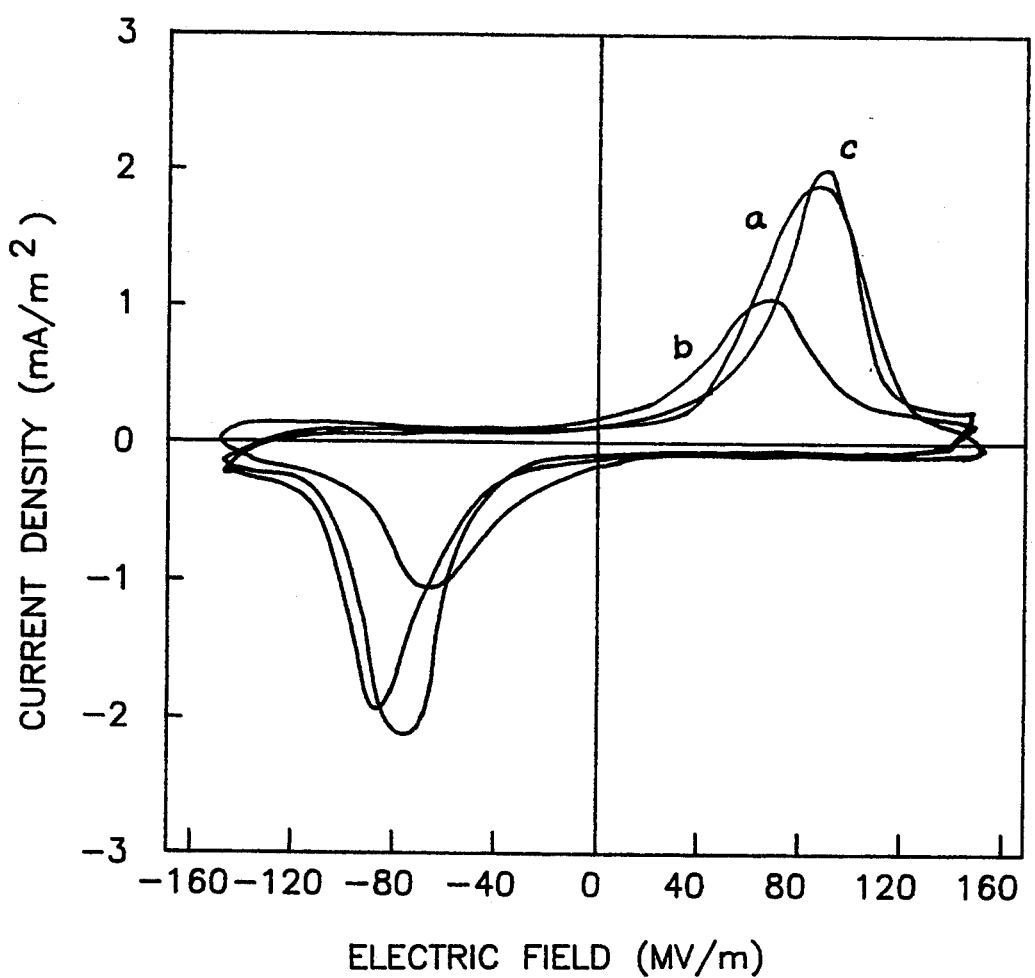
Figure 32:
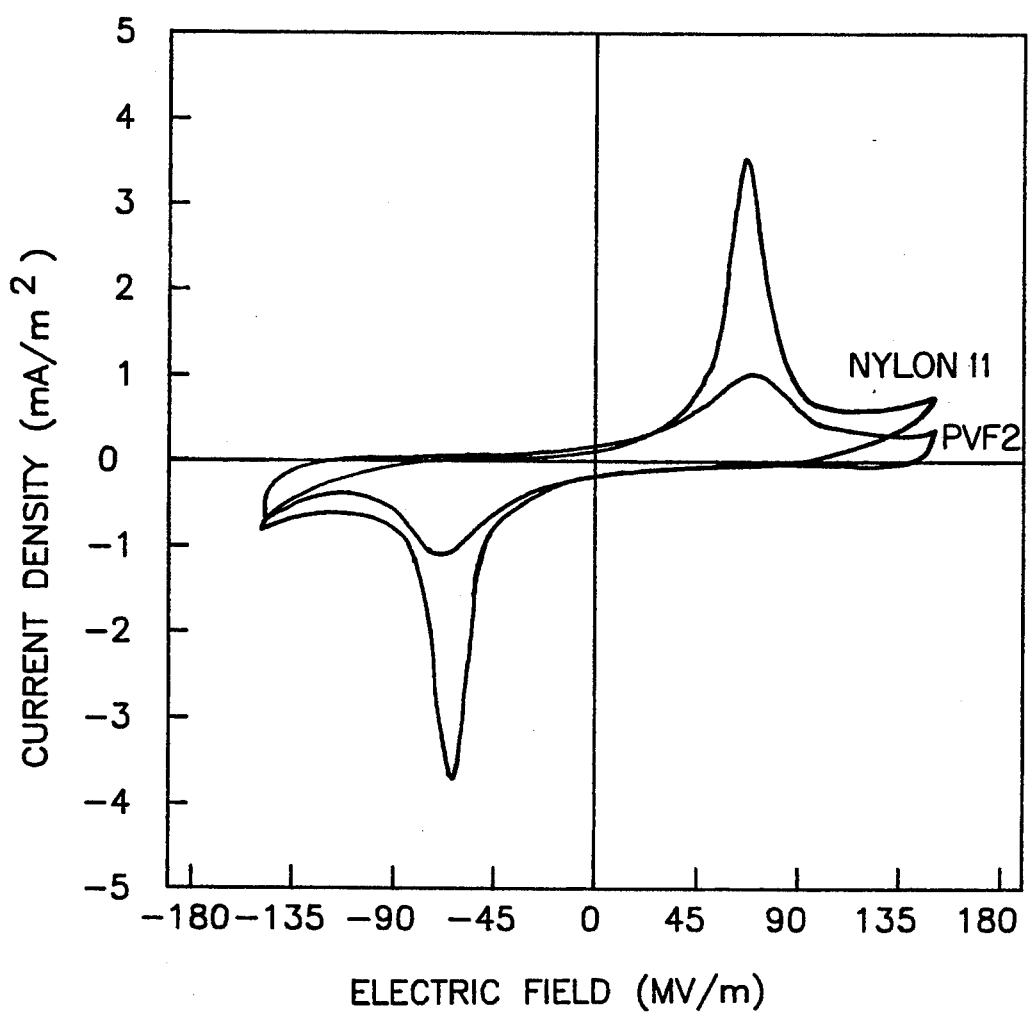
Figure 33:
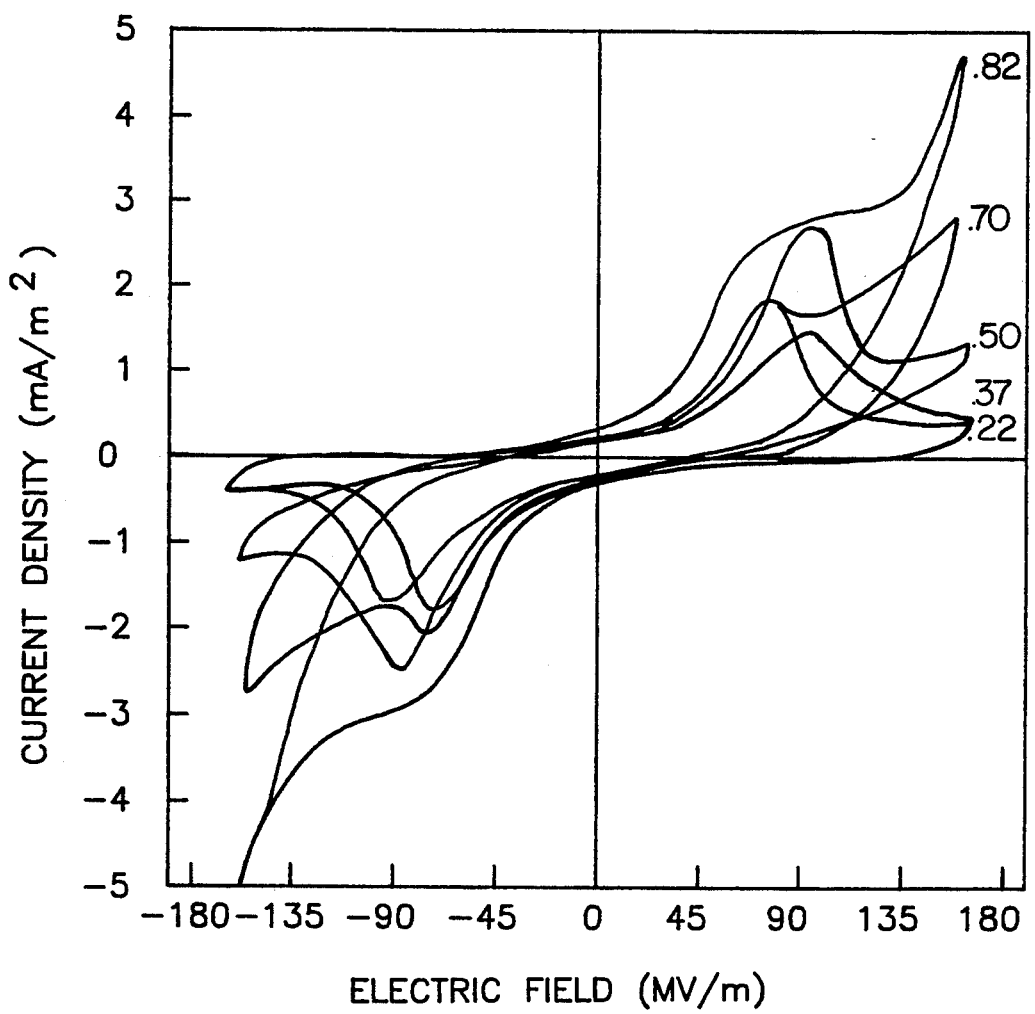

In FIG. 6, the temperature dependence of dielectric constants of Nylon 11/PVF$_2$ bilaminate, Nylon 11 and PVF$_2$ are shown. The dielectric constant of the bilaminate is much higher than the value calculated by the simple equation for dielectric constant of multilayer capacitor which is series $1/\epsilon = f_1/\epsilon_1 + F_2/\epsilon_2$ where $\epsilon$ is dielectric constant and f, volume fraction of the component.

The results show that the provided Nylon 11/PVF$_2$ bilaminate films are ferroelectric with the clear D-E hysteresis loop.

The Nylon 11/PVF$_2$ bilaminate films show a significantly higher remanent polarization, $P_r$ (75 mc/m$^2$), which is 44% higher than that of either Nylon 11 or PVF$_2$ film, which were produced in an identical procedure.

The piezoelectric response-piezoelectric strain constant, $d_{31}$, and piezoelectric stress constant, $e_{31}$ of Nylon 11/PVF$_2$ bilaminate films show their significant enhancement at both room and elevated temperatures when compared with Nylon 11 or PVF$_2$ film.

EXAMPLE 2

A co-melt-pressing-quenching procedure is used to make the following bilaminate films: Nylon 7/PVF$_2$; Nylon 11/VF$_2$-VF$_3$ copolymer and PVF$_2$/VF$_2$-VF$_3$. The films are uniaxially stretched at room temperature.

| | |
|---|---|
| Melting & pressing temperature | 210° C. |
| Quenching condition | Ice bath |
| Drawing temperature | 25° C. |
| Drawing ratio | 3.5:1 |
| Film thickness | 20–50 micrometers |

Electrode Formation

Gold was evaporated onto opposing sides of the bilaminate films under high vacuum (10$^{-6}$ torr.)

| | |
|---|---|
| Electrode area | 10–20 mm$^2$ |
| Electrode thickness | 1–2 micrometers |

Poling Treatment

The samples are poled in silicon oil at room temperature. The applied electric field has the following characteristics:

| | |
|---|---|
| Shape | Triangular |
| Maximum field | 150 MV/m |
| Period | 1000 sec |

FIGS. 2 to 33 show properties of the piezoelectric laminate films provided.

What is claimed is:

1. A method for providing a piezoelectric laminate film comprising the following steps:
   a) melting at least two polymeric films formed of different polymers and quenching them;
   b) place one surface of one quenched film upon one surface of another quenched film in intimate contact therewith;
   c) laminate said quenched films whose surfaces are in intimate contact by co-melt pressing;
   d) repeat steps b) and c) until all polymeric films are laminated;
   e) quench said laminate;
   f) cold draw said quenched laminate, and
   g) pole said drawn laminate to form said piezoelectric laminate film having one or more properties superior to the corresponding property of the individual polymeric films used to make said piezoelectric laminate film.

2. A method of claim 1 wherein the formed piezoelectric laminate film is annealed.

3. A method of cLaim 1 wherein at least one polymeric film is poly(vinylidene fluoride) film.

4. A method of claim 1 wherein at least one polymeric film is an odd Nylon film.

5. A method of claim 1 wherein the provided piezoelectric laminate film has a poly(vinylidene fluoride) film and Nylon 7 or Nylon 11 film in laminated relationship.

* * * * *